(12) United States Patent
Kim et al.

(10) Patent No.: US 11,309,033 B2
(45) Date of Patent: Apr. 19, 2022

(54) MEMORY DEVICE

(71) Applicant: SAMSUNG ELECTRONICS CO., LTD., Suwon-si (KR)

(72) Inventors: Taehyo Kim, Daegu (KR); Daeseok Byeon, Seongnam-si (KR); Youngmin Jo, Hwaseong-si (KR); Seungwon Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/121,015

(22) Filed: Dec. 14, 2020

(65) Prior Publication Data

US 2021/0335427 A1 Oct. 28, 2021

(51) Int. Cl.
| | |
|---|---|
| *G11C 16/22* | (2006.01) |
| *G11C 16/04* | (2006.01) |
| *G11C 16/10* | (2006.01) |
| *G11C 16/26* | (2006.01) |
| *H01L 27/11556* | (2017.01) |
| *H01L 27/11529* | (2017.01) |
| *H01L 27/11573* | (2017.01) |
| *H01L 25/065* | (2006.01) |
| *H01L 25/18* | (2006.01) |
| *H01L 23/00* | (2006.01) |
| *H01L 27/11582* | (2017.01) |

(52) U.S. Cl.
CPC .......... *G11C 16/22* (2013.01); *G11C 16/0483* (2013.01); *G11C 16/10* (2013.01); *G11C 16/26* (2013.01); *H01L 24/08* (2013.01); *H01L 25/0657* (2013.01); *H01L 25/18* (2013.01); *H01L 27/11529* (2013.01); *H01L 27/11556* (2013.01); *H01L 27/11573* (2013.01); *H01L 27/11582* (2013.01); *H01L 2224/08145* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS

| | | | |
|---|---|---|---|
| 5,991,197 A | * | 11/1999 | Ogura .................... G11C 16/22 365/185.11 |
| 7,979,658 B2 | | 7/2011 | Obereiner et al. |
| 9,258,111 B2 | | 2/2016 | Lee et al. |
| 2008/0022396 A1 | | 1/2008 | Kado |

(Continued)

FOREIGN PATENT DOCUMENTS

KR    10-2019483    7/2019

*Primary Examiner* — Tan T. Nguyen
(74) *Attorney, Agent, or Firm* — F. Chau & Associates, LLC

(57) ABSTRACT

A memory device including: a memory area having a first memory block and a second memory block; and a control logic configured to control the first memory block and the second memory block in a first mode and a second mode, wherein in the first mode only a control operation for the first memory block is executable, and in the second mode control operations for the first memory block and the second memory block are executable, wherein the control logic counts the number of accesses made to the second memory block in the first mode, and stores the number of accesses as scan data in the second memory block.

20 Claims, 20 Drawing Sheets

(56) References Cited

U.S. PATENT DOCUMENTS

| | | |
|---|---|---|
| 2009/0006866 A1 | 1/2009 | Chang |
| 2017/0262383 A1 | 9/2017 | Lee et al. |
| 2018/0181331 A1 | 6/2018 | Asari et al. |
| 2020/0073573 A1* | 3/2020 | Park .................... G11C 29/808 |
| 2020/0143891 A1* | 5/2020 | Takeyama .............. G11C 16/16 |
| 2020/0310646 A1* | 10/2020 | Song .................... G06F 3/0679 |

* cited by examiner

MEMORY DEVICE

CROSS-REFERENCE TO RELATED APPLICATION(S)

This application claims priority under 35 U.S.C. 119(a) to Korean Patent Application No. 10-2020-0049740 filed on Apr. 24, 2020 in the Korean Intellectual Property Office, the disclosure of which is incorporated by reference herein in its entirety.

TECHNICAL FIELD

The present inventive concept relates to a memory device.

DESCRIPTION OF RELATED ART

Memory devices are used to store and transfer data. Memory devices may provide a function for writing and erasing data or reading stored data. Security data of a system may be stored in a nonvolatile memory device. In this case, the security data is maintained even when the system's power is turned off. The memory device may store security data separate from general data. Even with this safeguard in place, the security data may still be hacked.

SUMMARY

According to an exemplary embodiment of the inventive concept, there is provided a memory device including: a memory area having a first memory block and a second memory block; and a control logic configured to control the first memory block and the second memory block in a first mode and a second mode, wherein in the first mode only a control operation for the first memory block is executable, and in the second mode control operations for the first memory block and the second memory block are executable, wherein the control logic counts the number of accesses made to the second memory block in the first mode, and stores the number of accesses as scan data in the second memory block.

According to an exemplary embodiment of the inventive concept, there is provided a memory device including: a memory area having a plurality of memory blocks; and a control logic configured to control the memory area, wherein the control logic blocks access to at least one security block among the plurality of memory blocks in a first mode, and allows access to the at least one security block in a second mode, different from the first mode, and when a reading operation for the at least one security block is executed in the first mode, the reading operation and a programming operation for the at least one security block are executed.

According to an exemplary embodiment of the inventive concept, there is provided a memory device including: first word lines stacked on a substrate; first channel layers penetrating through the first word lines to extend in a first direction perpendicular to the substrate, and providing first memory cells accessible in a first mode and a second mode, different from the first mode; second word lines stacked on the substrate and electrically separated from the first word lines; second channel layers penetrating through the second word lines to extend in the first direction, and providing second memory cells accessible only in the second mode; and a control logic configured to select one of the first mode and the second mode as an operation mode, and store data corresponding to the number of times the second memory cells are accessed in the first mode, in the second memory cells.

BRIEF DESCRIPTION OF DRAWINGS

The above and other features of the present inventive concept will be more clearly understood by describing in detail exemplary embodiments thereof with reference to the accompanying drawings, in which.

DETAILED DESCRIPTION OF THE EMBODIMENTS

Figure 1:
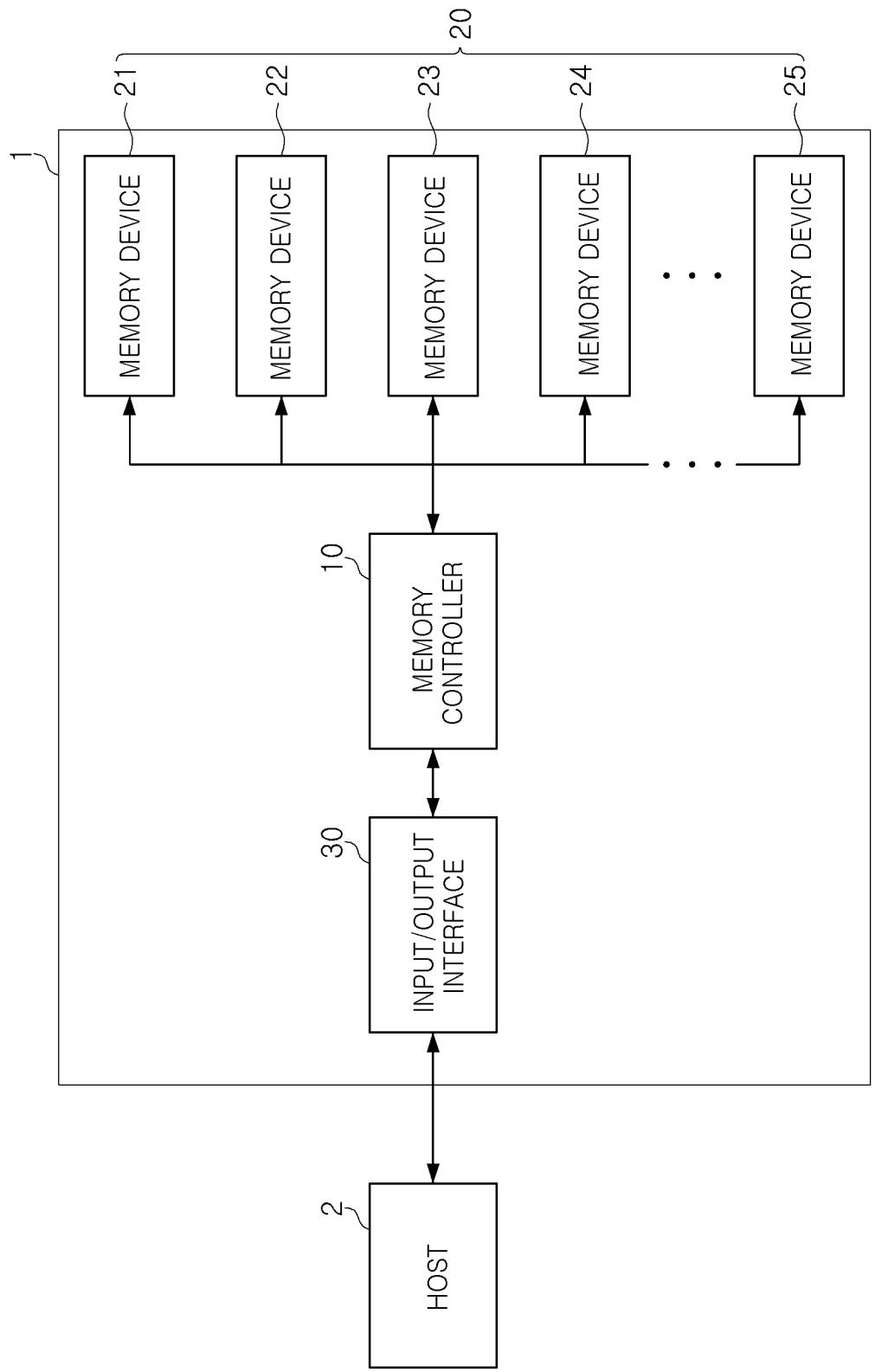
FIG. 1 is a diagram schematically illustrating a memory system according to an exemplary embodiment of the inventive concept.

Hereinafter, exemplary embodiments of the inventive concept will be described with reference to the accompanying drawings. In the drawings, like reference numerals may refer to like elements.

FIG. 1 is a diagram schematically illustrating a memory system according to an exemplary embodiment of the inventive concept.

Referring to FIG. 1, a memory system 1 according to an exemplary embodiment of the inventive concept may include a memory controller 10, memory devices (21-25: 20), an input/output interface 30, and the like. The memory system I may be a solid state drive (SSD) device, a memory card, or the like, and may communicate with a host 2 through the input/output interface 30. The host 2 is a device that stores data in the memory system 1 and reads data from the memory system 1, and may include a computer device such as a smartphone, a tablet personal computer (PC), a laptop computer, a desktop computer or the like, and a household appliance such as a television, a refrigerator, a set-top box, or the like.

The memory controller 10 is provided as a separate semiconductor chip from the memory devices 20 and may control the memory devices 20. Each of the memory devices 20 is implemented with a separate semiconductor chip, and may operate in response to a control command received from the memory controller 10. For example, each of the memory devices 20 may store data received from the memory controller 10 or read the stored data and transmit the read data to the memory controller 10.

The memory devices 20 may have non-volatile characteristics, and data stored in the memory devices 20 may be maintained even after the power from the host 2 or the internal power of the memory system 1 is cut off. Accordingly, various types of security data used for the operation of the memory system 1 and/or the host 2, for example, security data such as a root key, a master key, a public key, and individual keys, may be stored in the memory devices 20 of the memory system 1. The memory system 1 may adopt various security policies to protect security data from attacks such as external hacking.

As an example of a security policy, an operation mode of the memory system 1 may be discriminated, and access rights to the memory devices 20 may be managed so that security data may be accessed only in a specific operation mode. However, despite such a security policy, security data may be obtained by a hacker employing a scheme of scanning all memory areas included in the memory devices 20 and analyzing a data pattern or the like.

In an exemplary embodiment of the present inventive concept, the access rights may be managed so that security data may only be accessed in a specific operation mode by distinguishing the operation modes of respective memory devices 20. Thus, when an abnormal access to the security data is detected, the number of abnormal access times may be counted and stored. The number of abnormal access times may be stored as flag data in a memory area that includes the security data. For example, the memory area may be a unit area in which a deletion operation is executed. Therefore, when an attacker wishes to delete the flag data, since the security data is stored in the same memory area as that of the flag data, both the flag data and the security data are deleted together to prevent leakage of the security data to the outside.

Figure 2:
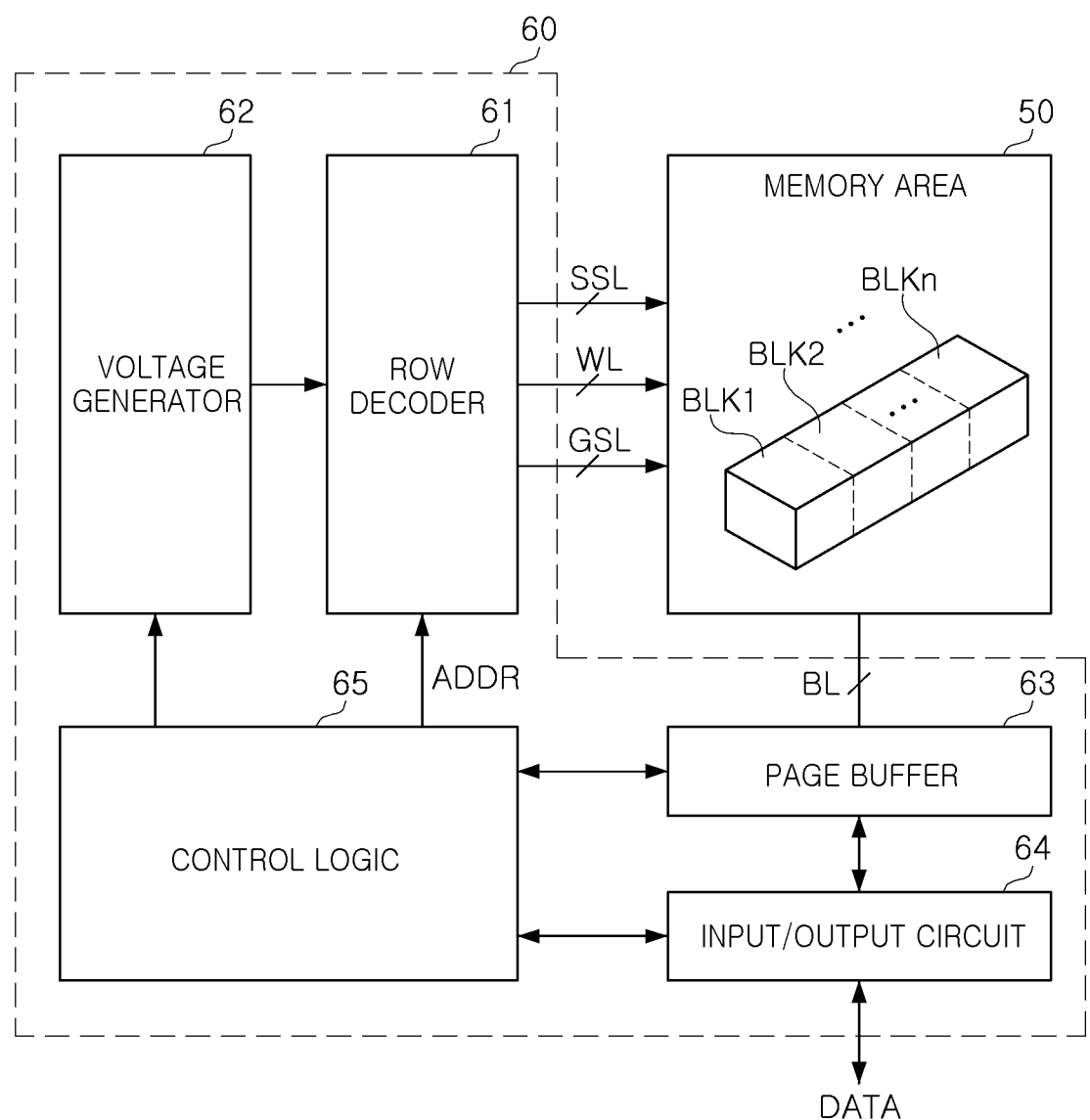
FIG. 2 is a diagram schematically illustrating a memory device according to an exemplary embodiment of the inventive concept.

FIG. 2 is a diagram schematically illustrating a memory device according to an exemplary embodiment of the inventive concept.

Referring to FIG. 2, a memory device 40 may include a memory area 50 and a peripheral circuit 60. The peripheral circuit 60 may include a row decoder 61, a voltage generator 62, a page buffer 63, an input/output circuit 64, a control logic 65 and the like.

The memory area 50 includes a plurality of memory cells and may be divided into a plurality of blocks BLK1-BLKn. The plurality of memory cells may be connected to the row decoder 61 through a string select line SSL, word lines WL and a ground select line GSL, and may be connected to the page buffer 63 through bit lines BL. In an example, in each of the blocks BLK1-BLKn, a plurality of memory cells arranged at the same height from a substrate are connected to the same word line WL, and a plurality of memory cells disposed at the same position in a plane parallel to the upper surface of the substrate may provide a memory cell string sharing one channel region. In addition, some of the memory cell strings included in each of the blocks BLK1-BLKn may be connected to the same bit line BL.

The row decoder 61 may decode address data ADDR received from the control logic 65 or the like, and generate and transfer voltages for driving the word lines WL. The row decoder 61 may input the word line voltage generated by the voltage generator 62 in response to the control of the control logic 65 to the word lines WL. For example, the row decoder 61 is connected to the word lines WL through pass transistors, and when the pass transistors are turned on in response to a signal provided from the control logic 65, the word line voltage may be input to the word lines WL.

The page buffer 63 is connected to the memory area 50 through bit lines BL, and may read data stored in the memory cells or may write data to the memory cells. The page buffer 63 may include a column decoder, a latch circuit, and the like. The column decoder may select at least a portion of the bit lines BL of the memory area 50, and the latch circuit may read data of a memory cell connected to the bit line BL selected by the column decoder during a reading operation.

The input/output circuit 64 may receive data (DATA) during a programming operation and transfer the data to the page buffer 63. In addition, the input/output circuit 64 may output the data read from the memory area 50 by the page buffer 63 to the outside. The input/output circuit 64 may transmit an address or command received from an external memory controller to the control logic 65.

The control logic 65 may control operations of the row decoder 61, the voltage generator 62, the page buffer 63 and the like. In an exemplary embodiment of the inventive concept, the control logic 65 may operate in response to a control command transmitted from an external memory controller or the like.

The voltage generator 62 may generate control voltages used for the operation of the memory device 40, for example, a programming voltage, a reading voltage, an erasing voltage, a pass voltage and the like, using an external input voltage. The voltage generated by the voltage generator 62 may be supplied to the peripheral circuit 60 or may be input to the memory area 50 through the row decoder 61 or the like.

The control logic 65 may select one of a first mode and a second mode to control the memory blocks BLK1-BLKn included in the memory area 50. In an exemplary embodiment of the inventive concept, at least one of the memory blocks BLK1-BLKn may be set as a security block, and unlike the other memory blocks, the security block may be set to be accessible only in the second mode. The control logic 65 may store security data of the memory device 40 and/or a host operating in connection with the memory device 40 in a security block.

When the access to the security block is detected in the first mode, the control logic 65 may count the number of accesses to the security block in the first mode, and may store the counted number of accesses in the security block as scan data. For example, the control logic 65 may detect whether an abnormal access to the security block occurs in an operation mode in which the security block cannot be normally accessed. In addition, the number of executions of abnormal access to the security block may be stored in the security block as scan data. Therefore, in the first mode, when an access to the security block occurs or an access attempt occurs, a programming operation for recording scan data may be executed in the security block together with a reading operation. In an example, the programming operation may be executed before or after the reading operation, or may be executed concurrently with the reading operation.

The control logic 65 may execute the security process when the number of executions included in the scan data increases to a predetermined reference number. As an example, the security process may include a process of completely blocking access to a security block in which security data and scan data are stored. For example, after passing an authentication procedure using a predetermined password, biometric information, or the like, blocking access to the security block may be released. Alternatively, the security process may be executed when any access to the security block occurs or any access attempt occurs to restrict access the security block only after passing the authentication process based on password, biometric information, or the like.

In addition, an attempt to initialize the scan data may be prevented by storing the scan data in a security block in which the security data is stored. In an example, an erase operation of deleting data stored in the memory area 50 in the memory device 40 may be executed in the unit of each of the memory blocks BLK1-BLKn. Therefore, when initialization of the scan data is attempted, all data stored in the security block is deleted, and security data leakage may be prevented.

Figure 3:
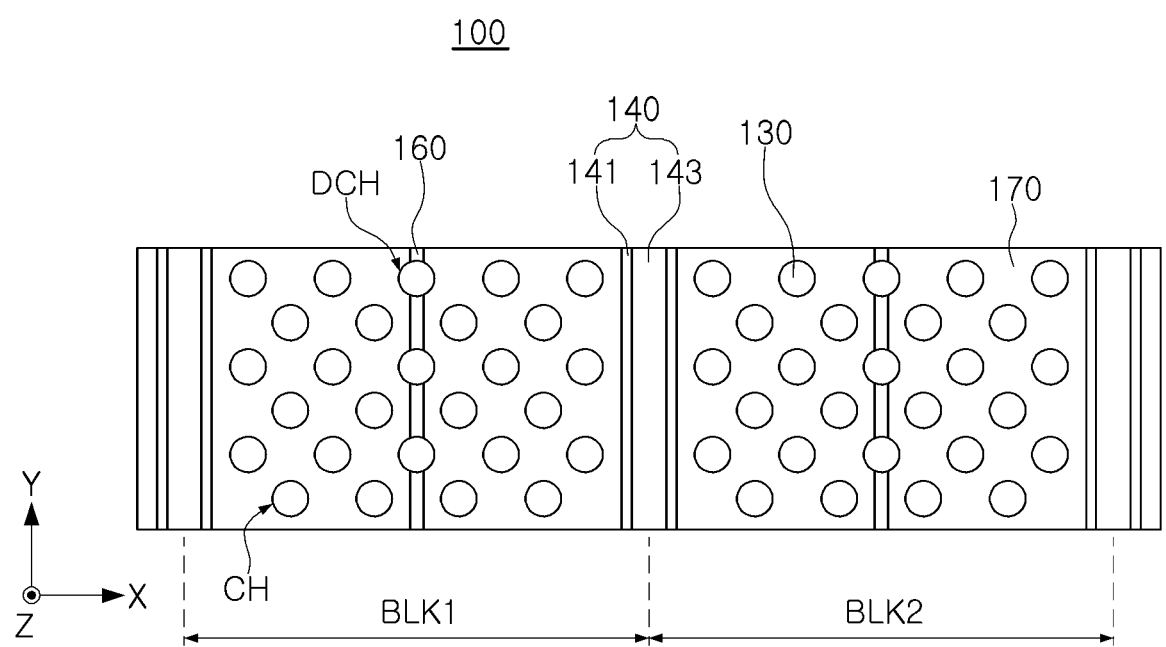
FIGS. 3, 4 and 5 are views schematically illustrating a memory device according to an exemplary embodiment of the inventive concept.
Figure 4:
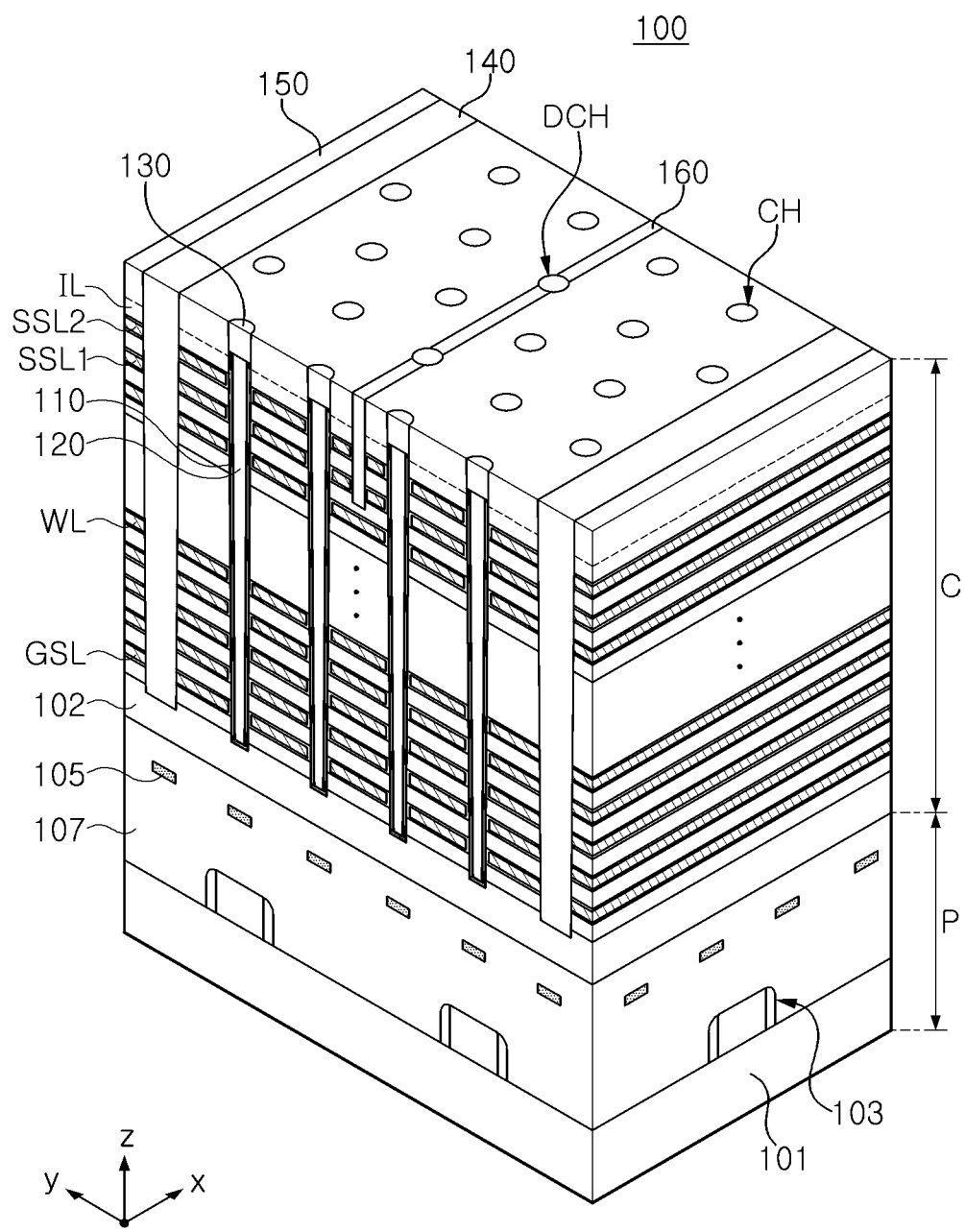
Figure 5:
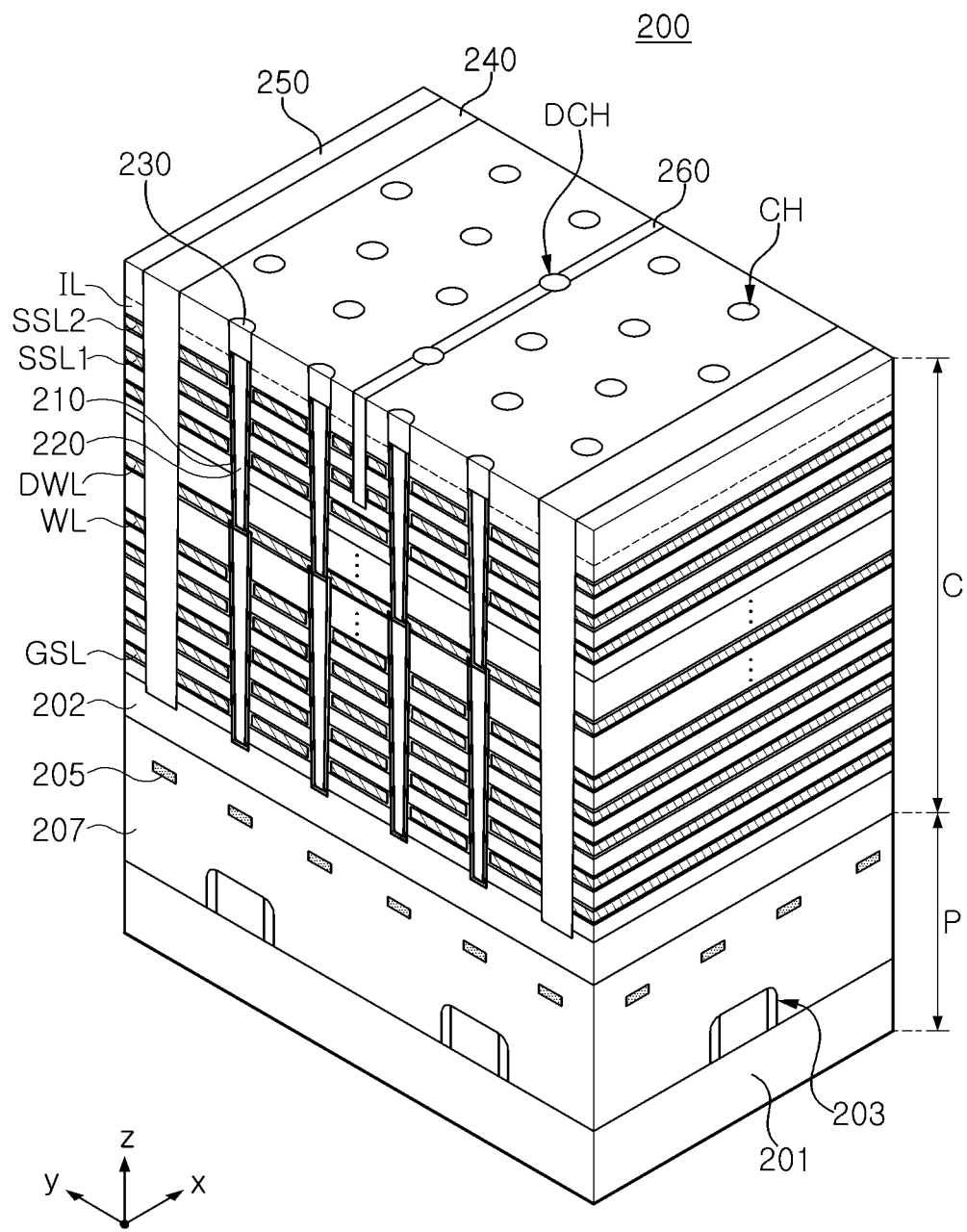

FIGS. 3 to 5 are views schematically illustrating a memory device according to an exemplary embodiment of the inventive concept.

Referring first to FIG. 3, a memory device 100 according to an exemplary embodiment of the inventive concept may include a plurality of blocks BLK1 and BLK2. The plurality of blocks BLK1 and BLK2 may have the same structure as each other, and may be discriminated by separation layers 140.

FIG. 4 may be a perspective view illustrating one of the blocks BLK1 and BLK2 in the memory device 100 illustrated in FIG. 3. Referring to FIGS. 3 and 4 together, the memory device 100 according to an exemplary embodiment of the inventive concept may include a cell region C and a peripheral circuit region P that are disposed above and below each other. The peripheral circuit region P may be disposed below the cell region C, and the peripheral circuit region P includes a first substrate 101, and the cell region C includes a second substrate 102 different from the first substrate 101.

For example, the peripheral circuit region P may include a plurality of peripheral circuit elements 103 provided on the first substrate 101, a plurality of wiring lines 105 connected to the peripheral circuit elements 103, a first interlayer insulating layer 107 covering the peripheral circuit elements 103 and the wiring lines 105, and the like. The peripheral circuit elements 103 included in the peripheral circuit region P may provide circuits used to the memory device 100, for example, a page buffer, a row decoder, and the like.

The second substrate 102 included in the cell region C may be disposed on the first interlayer insulating layer 107. The cell region C may include a ground select line GSL, word lines WL, and string select lines SSL1 and SSL2 and a plurality of insulating layers IL stacked on the second substrate 102. The insulating layers IL may be alternately stacked with the ground select line GSL, the word lines WL, and the string select lines SSL1 and SSL2. The number of ground select lines GSL and string select lines SSL1 and SSL2 is not limited as illustrated in FIG. 4 and may be variously modified. In addition, the number of word lines WL is not limited as illustrated in FIG. 4 and may be variously modified.

In addition, the cell region C may include channel structures CH extending in a first direction (a Z-axis direction) perpendicular to the upper surface of the second substrate 102, and the channel structures CH may penetrate through the ground selection line GSL, the word lines WL and the string select lines SSL1 and SSL2 to be connected to the second substrate 102. The channel structures CH may include a channel region 110, a buried insulating layer 120 filling the inner space of the channel region 110, a bit line connection layer 130, and the like. Each of the channel structures CH may be connected to at least one bit line through the bit line connection layer 130. The ground select line GSL, the word lines WL, the string select lines SSL1 and SSL2, the insulating layers IL, and the channel structures CH may be referred to as a stacked structure.

At least one gate insulating layer may be disposed outside of the channel region 110. In an exemplary embodiment of the inventive concept, the gate insulating layer may include a tunneling layer, a charge storage layer, and a blocking layer sequentially disposed from the channel region 110. According to an exemplary embodiment of the inventive concept, at least one of the tunneling layer, the charge storage layer, and the blocking layer may surround the ground select line GSL, the word lines WL, and the string select lines SSL1 and SSL2.

The ground select line GSL, the word lines WL, and the string select lines SSL1 and SSL2 may be covered by an interlayer insulating layer 150. In addition, the ground select line GSL, the word lines WL, and the string select lines SSL1 and SSL2 may be separated into a plurality of blocks BLK1 and BLK2 by the separation layers 140. In an exemplary embodiment of the inventive concept, between a pair of separation layers 140 adjacent to each other in the second direction (the Y-axis direction), the string select lines SSL1 and SSL2 may be divided into a plurality of regions by an upper separation layer 160.

In an exemplary embodiment of the inventive concept, dummy channel structures DCH may be provided in an area in which the upper separation layer 160 is disposed. The dummy channel structures DCH may have the same structure as the channel structures CH, but may not be connected to the bit line.

In the embodiment illustrated in FIG. 4, the channel structures CH and the separation layers 140 have a shape extending in a first direction, and thus the width thereof may change in the first direction. Referring to FIG. 4, each of the channel structures CH and the separation layers 140 may have a tapered structure having a narrowing width as it approaches the second substrate 102.

Next, referring to FIG. 5, a memory device 200 according to an exemplary embodiment of the inventive concept may include a cell region C and a peripheral circuit region P that are disposed above and below each other. The memory device 200 according to the embodiment illustrated in FIG. 5 may have a structure similar to the memory device 100 according to the embodiment illustrated in FIG. 4, and thus, the description of similar features may be omitted. Similar reference numerals may be used to denote the same elements in FIGS. 4 and 5. For example, in FIG. 4, 101 is used to denote the first substrate and in FIG. 5 201 is used to denote the first substrate with '2' being the only difference. The remainder of the elements in FIG. 5 are similarly denoted with '2' and correspond to those denoted by '1' in FIG. 4.

In the embodiment illustrated in FIG. 5, to reduce a process issues due to an increase in the number of word lines WL, after stacking some word lines WL and forming a lower channel structure, the remaining word lines W L may be stacked and an upper channel structure may be formed. Accordingly, as illustrated in FIG. 5, each of the channel structures CH may include an upper channel structure and a lower channel structure. For example, the lower channel structure and the word lines through which the lower channel structure penetrates may be referred to as a lower stacked structure, and the upper channel structure and the word lines through which the upper channel structure penetrates may be referred to as an upper stacked structure.

The lower channel structure may extend from a second substrate 202, and the upper channel structure may extend from the lower channel structure to be connected to the bit line through a bit line connection layer 230. In each of the channel structures CH, a channel region 210 of the upper channel structure and a channel region 210 of the lower channel structure may be connected to each other.

In the memory devices 100 and 200 according to the embodiments described with reference to FIGS. 3 to 5, the memory cells may be provided by the channel structures CH and the word lines WL. Memory cells included in each of the memory blocks BLK1 and BLK2 may share the channel structures CH or the word lines WL. For example, memory cells disposed at the same height in the first direction (the Z-axis direction) in each of the memory blocks BLK1 and BLK2 may share one of the word lines WL. In addition, memory cells disposed at the same location in the second direction (the Y-axis direction) and the third direction (the X-axis direction) in each of the memory blocks BLK1 and BLK2 may share one of the channel structures CH. FIG. 5 also shows a dummy word line DWL.

The erase operation for the data stored in the memory cells may be executed in the unit of each of the memory blocks BLK1 and BLK2 divided by separation layers 140 and 240. In an exemplary embodiment of the inventive concept, a predetermined bias voltage is input to the word lines WL, and an erase voltage is input to the substrates 102 and 202 to perform a deletion operation. Accordingly, the erase operation may be executed in the units of memory blocks BLK1 and BLK2 separating the word lines WL.

In an exemplary embodiment of the inventive concept, at least one of the memory blocks BLK1 and BLK2 is allocated as a security block to store security data. Scan data, which is obtained by counting the number of execution times a control operation abnormally accesses the security data, may also be stored in the security block. In addition, when the number of execution times included in the scan data increases to a predetermined reference number, access to the security block may be blocked by executing a security process. For example, in a case where an attempt is made to access the security data again by initializing the scan data, the security data stored in the security block together with the scan data is initialized (e.g., deleted) together, thereby effectively protecting the security data.

Figure 6:
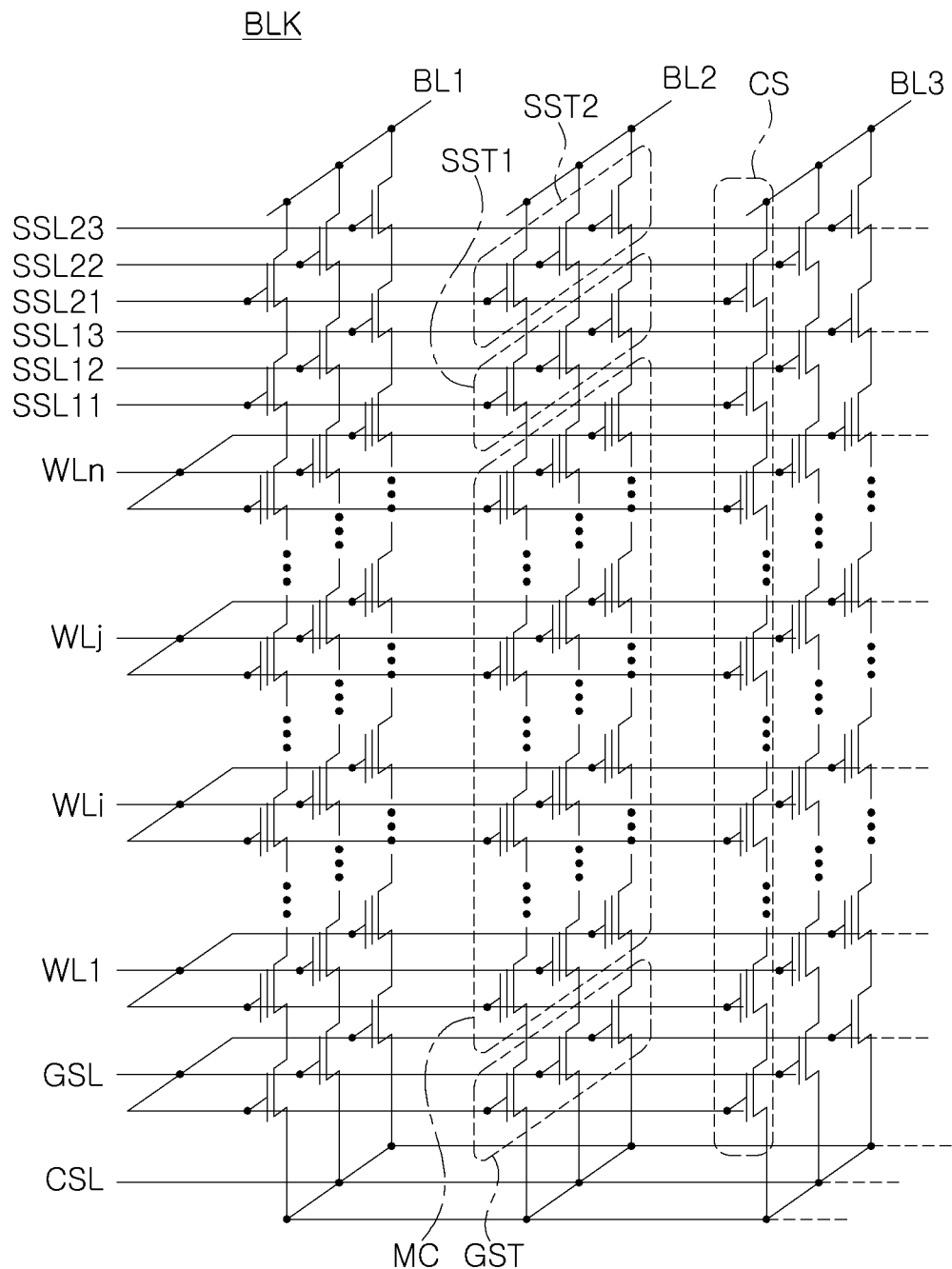
FIG. 6 is a circuit diagram provided to describe the operation of a memory device according to an exemplary embodiment of the inventive concept.

FIG. 6 is a circuit diagram provided to describe the operation of a memory device according to an exemplary embodiment of the inventive concept.

Referring to FIG. 6, one memory block BLK may include a plurality of memory cell strings CS, and at least some of the memory cell strings CS may include word lines WL1-WLn and/or bit lines BL1-BL3.

Each of the memory cell strings CS may include a plurality of memory cells MC connected between first and second string select transistors SST1 and SST2 and a ground select transistor GST. The first and second string select transistors SST1 and SST2 are connected to each other in series, and the second string select transistor SST2 disposed on the first string select transistor SST1 may be connected to one of the bit lines BL1-BL3. The ground select transistor GST may be connected to a common source line CSL. The memory cells MC included in each of the memory cell strings CS may share one channel region.

The plurality of memory cells MC may be connected to each other in series between the first and second string select transistors SST1 and SST2 and the ground select transistor GST. According to exemplary embodiments of the inventive concept, the number of string select transistors SST1 and SST2 and the ground select transistors GST may be variously modified, and each of the memory cell strings CS may further include at least one dummy memory cell. For example, the dummy memory cells may be connected between the first string select transistor SST1 and the memory cells MC and/or between the ground select transistor GST and the memory cells MC.

The gate electrodes of the plurality of memory cells MC may be connected to the word lines WL1-WLn. Further, the gate electrode of the ground select transistor GST may be connected to the ground select line GSL, and the gate electrodes of the first and second string select transistors SST1 and SST2 may be connected to string select lines SSL11, SSL12, SSL13, SSL21, SSL22 and SSL23.

The ground select line GSL, the word lines WL1-WLn, and the string select lines SSL11-SSL23 may be stacked in a first direction perpendicular to the upper surface of the substrate. The ground select line GSL, the word lines WL1-WLn, and the string select lines SSL11-SSL23 may be penetrated by a channel structure including a channel region. The channel structure may be connected to one of the bit lines BL1-BL3.

One memory block BLK may be a unit area of an erase operation executed in the memory device. For example, bias voltages may be input to the word lines WL1-WLn, the string select lines SSL11-SSL23, and the ground select line GSL, and a high erase voltage may be input to the common source line CSL. The charge trapped in the memory cells MC may be eliminated by the erase voltage input to the common source line CSL, and the memory cells MC included in the memory block BLK may be changed to an erase state.

When the memory block BLK is a security block that stores security data, scan data obtained by counting the number of abnormal accesses to the security data may be stored in the memory block BLK. For example, the security data may be stored in memory cells MC connected to a j-th word line WLj, and the scan data may be stored in memory cells connected to an i-th word line WLi. For example, the security data and the scan data may be stored in different pages in the memory block BLK.

When an initialization attempt to delete scan data occurs, data of all memory cells MC included in the memory block BLK may be deleted. Therefore, the security data is deleted together by an attempt to initialize the scan data, and leakage of the security data may be prevented.

Figure 7:
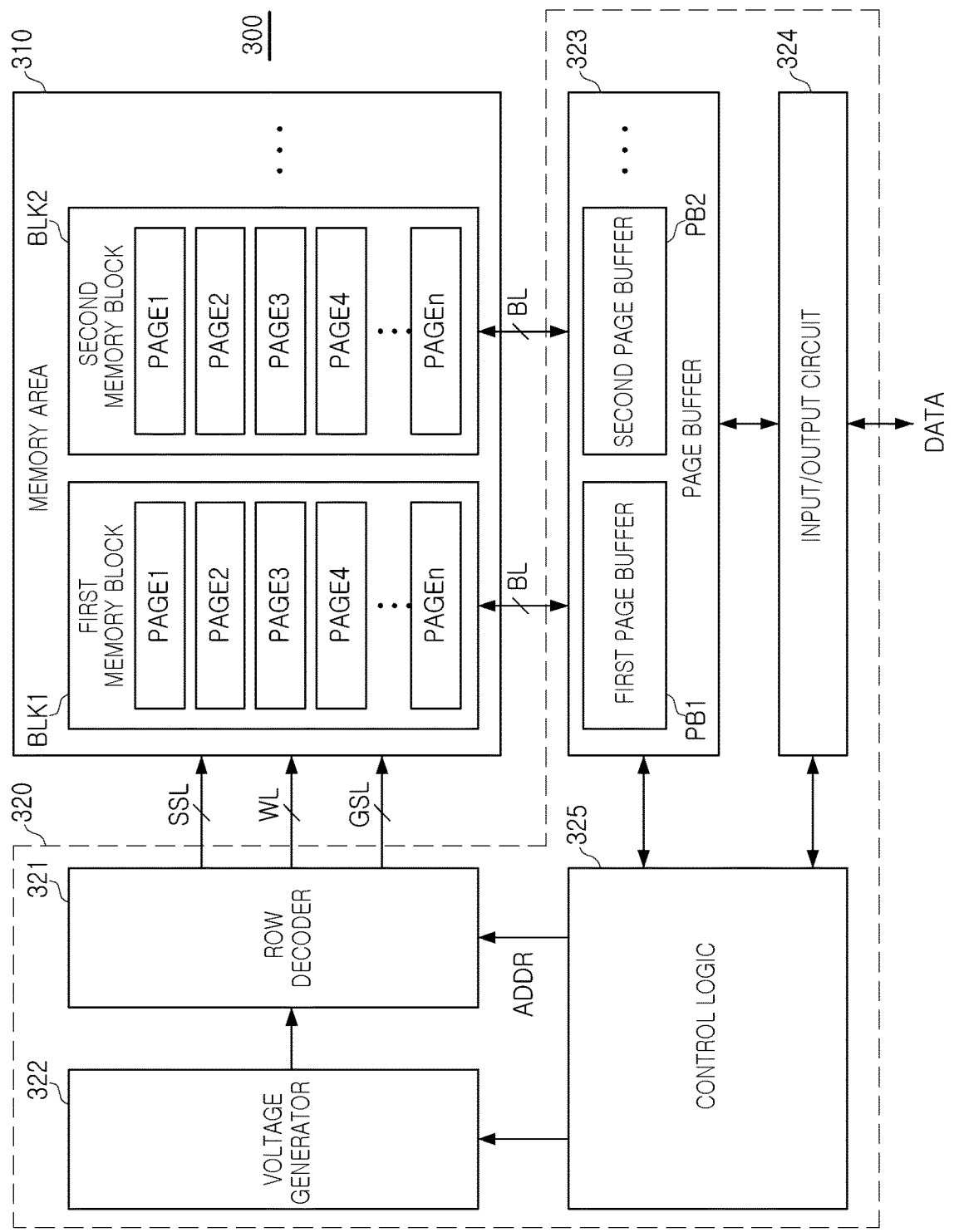
FIGS. 7, 8 and 9 are diagrams provided to illustrate the operation of memory devices according to exemplary embodiments of the inventive concept.
Figure 8:
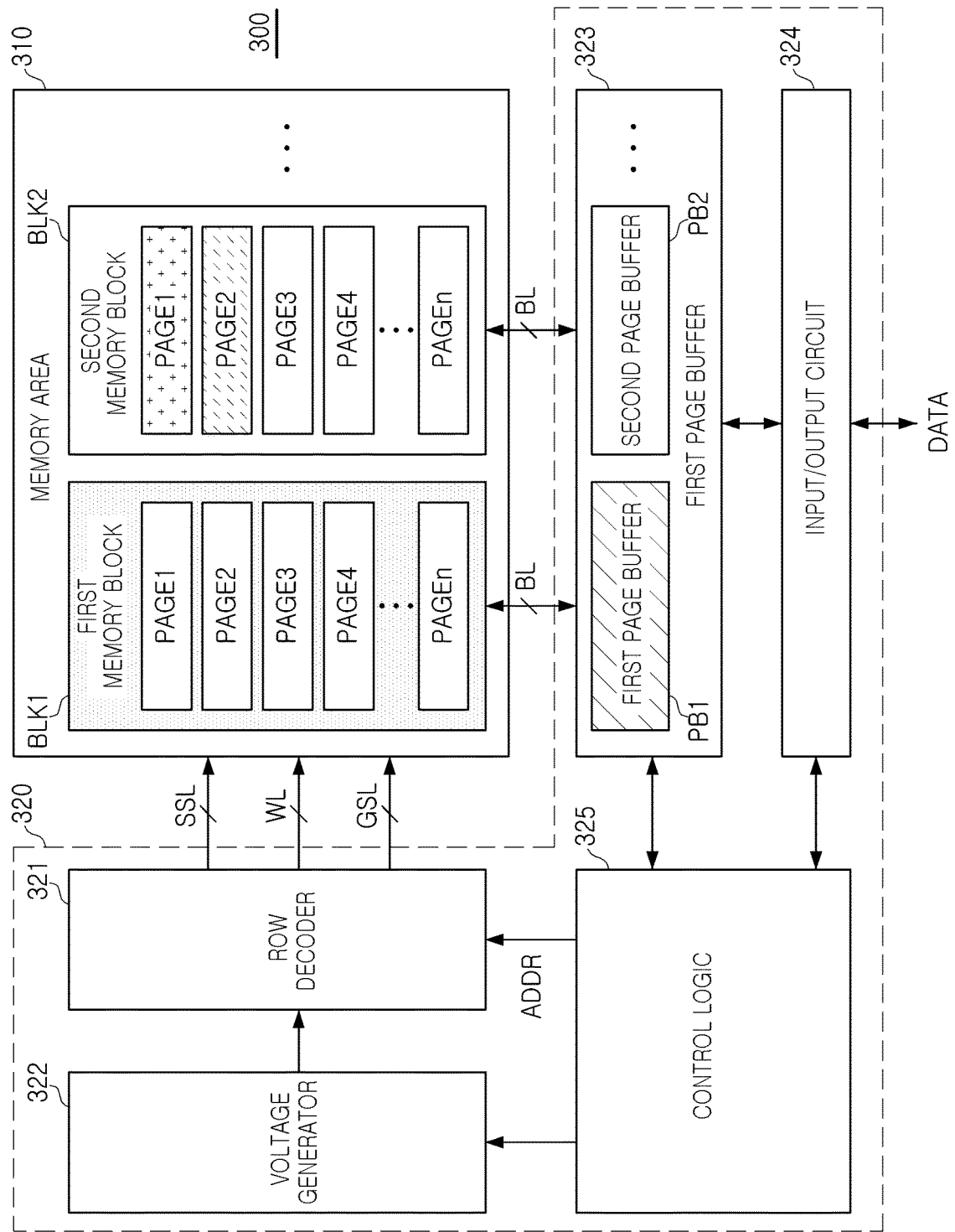
Figure 9:
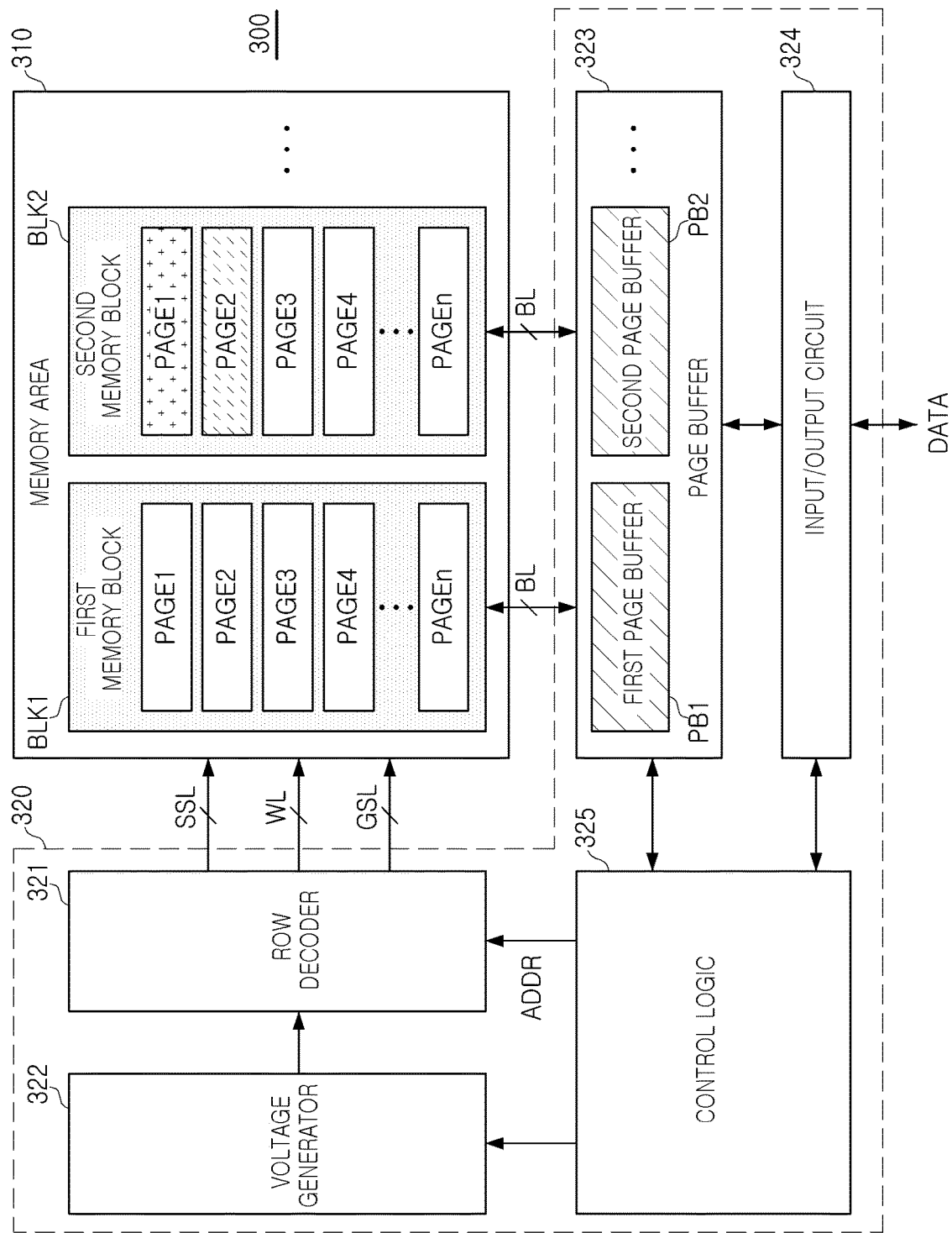

FIGS. 7 to 9 are diagrams provided to illustrate the operation of a memory device according to exemplary embodiments of the inventive concept.

Referring to FIG. 7, a memory device 300 according to an exemplary embodiment of the inventive concept may include a memory area 310 and a peripheral circuit 320. The peripheral circuit 320 may include a row decoder 321, a voltage generator 322, a page buffer 323, an input/output circuit 324, a control logic 325 and the like. The operation of components 321-325 included in the peripheral circuit 320 may be similar to those in the embodiment described with reference to FIG. 2 above.

The memory area 310 may include a first memory block BLK1 and a second memory block BLK2. However, the memory area 310 may further include other memory blocks in addition to the first memory block BLK1 and the second memory block BLK2. The first memory block BLK1 may be connected to a first page buffer PB1, and the second memory block BLK2 may be connected to a second page buffer PB2.

Each of the first memory block BLK1 and the second memory block BLK2 may include a plurality of pages PAGE1-PAGEn. Each of the pages PAGE1-PAGEn may be a unit in which the peripheral circuit 320 writes data. In an exemplary embodiment of the inventive concept, the pages PAGE1-PAGEn may be defined by word lines included in each of the memory blocks BLK1 and BLK2.

In the embodiment illustrated in FIG. 7, the first memory block BLK1 and the second memory block BLK2 may be controlled by the control logic 325 in different schemes. In an example, the control logic 325 may select one of a first mode and a second mode to control the memory area 310. For example, one of the first mode and the second mode may be a normal mode in which access to at least one of the memory blocks BLK1 and BLK2 included in the memory area 310 is restricted, and the other of the first mode and the second mode may be a secure mode accessible to both of the memory blocks BLK1 and BLK2. Hereinafter, for convenience of description, it is assumed that the first mode is the normal mode, the second mode is the secure mode, and the second memory block BLK2 is a security block accessible only in the second mode.

FIG. 8 is a diagram provided to describe the operation of the memory device 300 in the first mode. Referring to FIG. 8, in the first mode, the control logic 325 may control the memory device 300, such that only the first memory block BLK1 is accessible. The second memory block BLK2 allocated as a security block may store security data of the memory device 300 and/or a host connected to the memory device 300, and in the first mode, access to the second memory block BLK2 may be restricted.

In an exemplary embodiment of the inventive concept illustrated in FIG. 8, security data may be stored in a first page PAGE1 of the second memory block BLK2. In addition, the security data may also be stored in two or more pages PAGE1-PAGEn included in the second memory block BLK2 depending on the capacity of the security data. In addition, scan data indicating the number of accesses to the security data may be recorded on the second page PAGE2 of the second memory block BLK2. The scan data may be data recorded by counting the number of access times the second memory block BLK2 is accessed or the number of access times the second memory block BLK2 is attempted to be accessed in the first mode.

In the first mode, which is the normal mode, access to the second memory block BLK2 is basically limited, but the security data stored in the second memory block BLK2 may be leaked by an attacker, such as a hacker, who scans the entire memory area 310 and analyzes a data pattern. In an exemplary embodiment of the present inventive concept, the number of access times the second memory block BLK2 is accessed or attempted to be accessed in the first mode may be counted and may be written to the second memory block BLK2 as scan data.

When the number of access times stored as the scan data reaches a predetermined reference number, the control logic 325 may block the second memory block BLK2 from external sources in various ways. As an example, the control logic 325 may control the row decoder 321 and/or the voltage generator 322 to prevent a bias voltage used for a programming operation or a reading operation from being supplied to word lines WL connected to the second memory block BLK2. Alternatively, access to the second memory block BLK2 may be restricted by deactivating the second page buffer PB2 connected to the second memory block BLK2.

FIG. 9 is a diagram provided to describe the operation of the memory device 300 in the second mode. Referring to FIG. 9, in the second mode, the control logic 325 may control the memory device 300 to access the second memory block BLK2. In the second mode, operations such as writing data to the second memory block BLK2 or reading security data stored in the first page PAGE1 of the second memory block BLK2 may be normally executed, and may not be counted as the number of access times and stored as the scan data.

According to exemplary embodiments of the inventive concept, the first memory block BLK1 and the second memory block BLK2 may be controlled in different ways. Compared to the first memory block BLK1 in which general data is stored, the second memory block BLK2 stores security data having high importance, and thus, a relatively large data storage capacity may be allocated to the first memory block BLK1. For example, N bits of data may be stored in each of the memory cells included in the first memory block BLK1, and M bits of data may be stored in each of the memory cells included in the second memory block BLK2. N and M are both natural numbers, and M may be less than N. For example, each of the memory cells of the first memory block BLK1 may operate as a triple level cell or a quad level cell, and each of the memory cells of the second memory block BLK2 may operate as a single level cell or a multi level cell.

In the second memory block BLK2, security data and scan data having relatively high importance may be stored in pages PAGE1 and PAGE2 comprised of memory cells operating as single-level cells. In an example, the scan data may be stored in a plurality of flag cells operating as single-level cells, and the flag cells may share one word line WL in the second memory block BLK2. In addition, the scan data may be divided in a bit format and may be stored in flag cells. Methods of storing the scan data in the second memory block BLK2 will be described later.

When the first memory block BLK1 and the second memory block BLK2 are controlled using different methods, structures of the first page buffer PB1 and the second page buffer PB2 may be different, which will be described below with reference to FIGS. 10 and 11.

Figure 10:
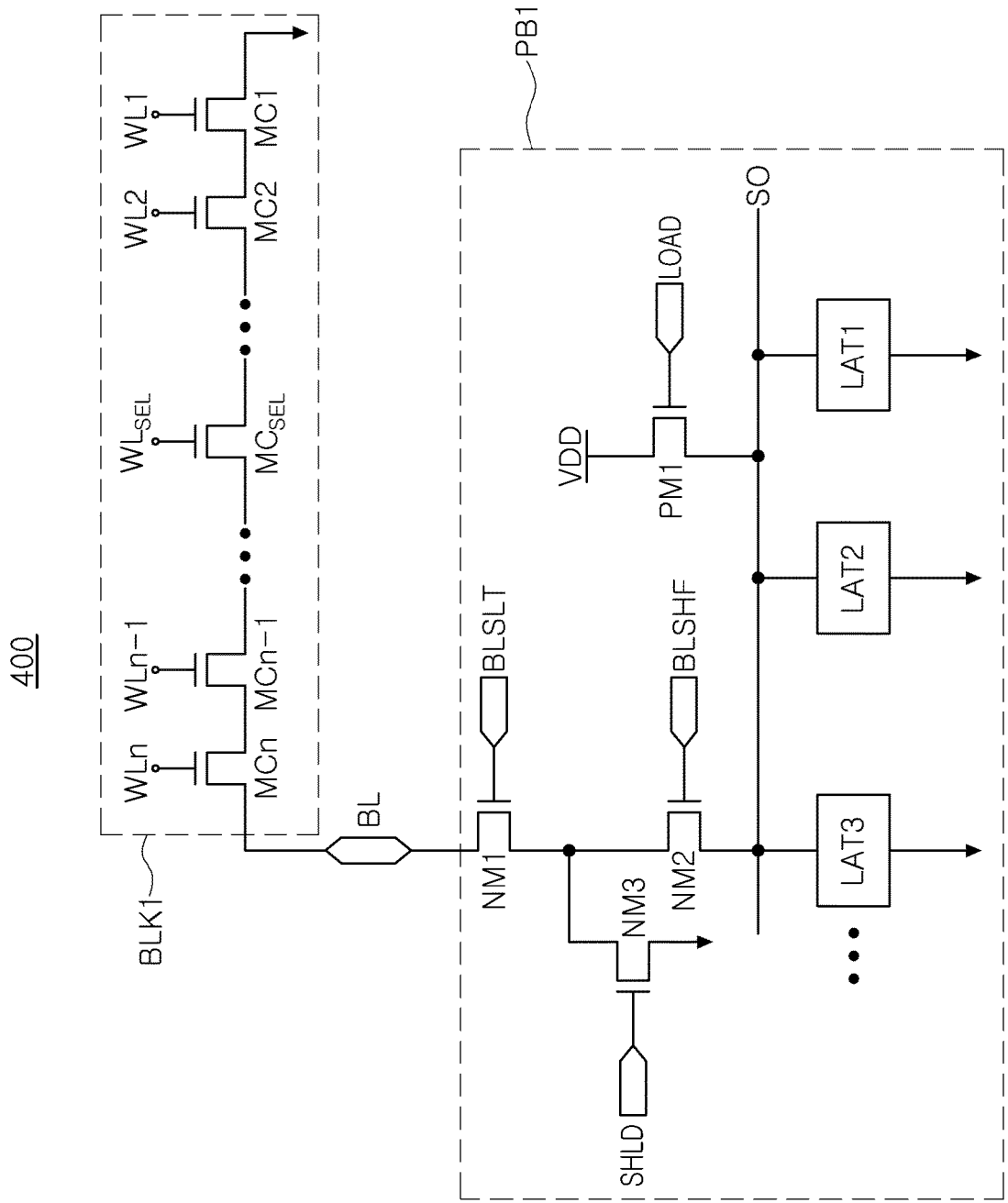
FIGS. 10 and 11 are circuit diagrams schematically illustrating a page buffer included in a memory device according to an exemplary embodiment of the inventive concept.
Figure 11:
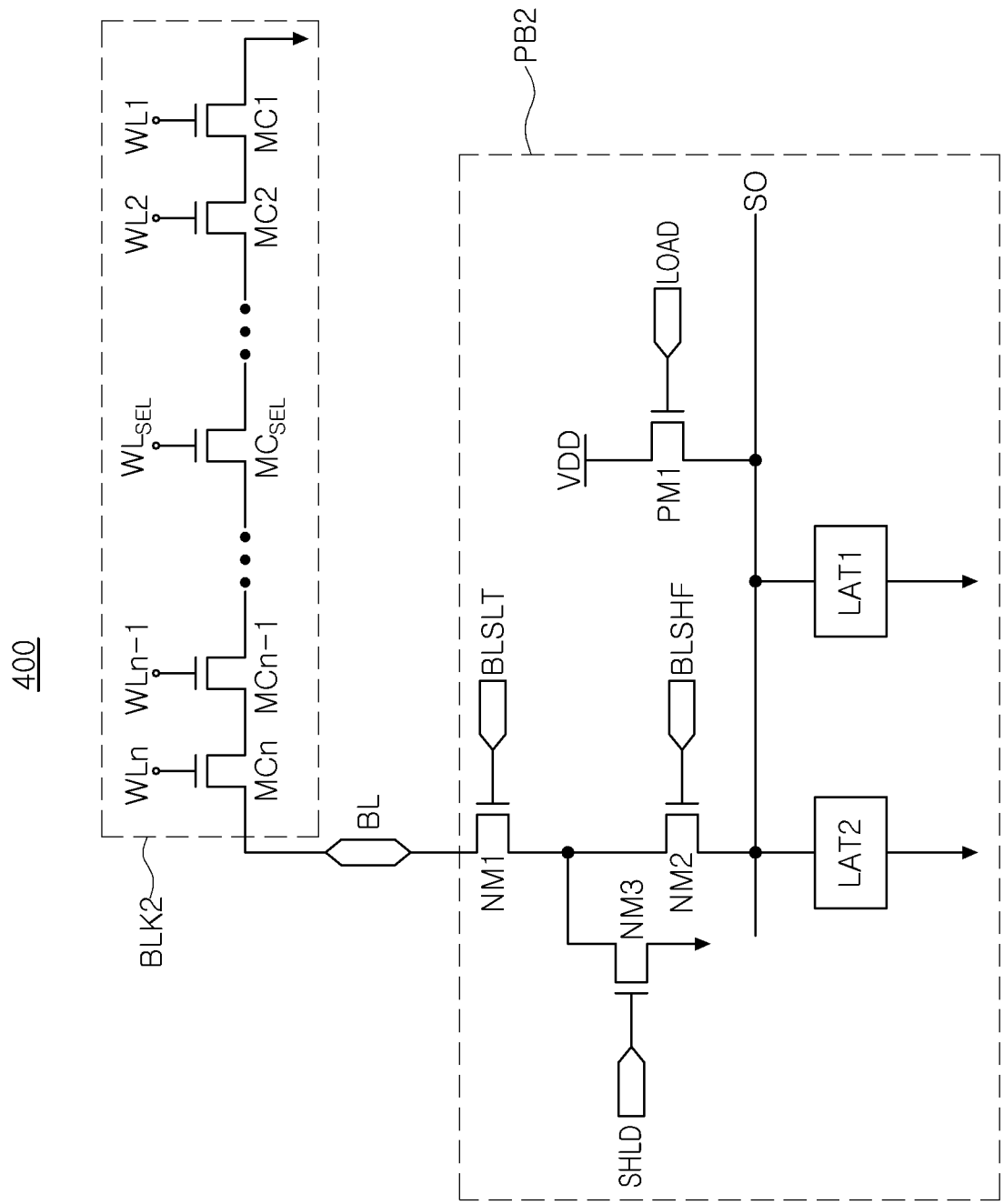

FIGS. 10 and 11 are circuit diagrams schematically illustrating a page buffer included in a memory device according to an exemplary embodiment of the inventive concept.

Referring to FIGS. 10 and 11, one memory device 400 may include a plurality of memory blocks BLK1 and BLK2 and a plurality of page buffers PB1 and PB2. For example, a first memory block BLK1 may be an accessible block when the memory device 400 operates in a normal mode and a secure mode. On the other hand, the second memory block BLK2 is not accessible in the normal mode, and may be a block accessible only in the secure mode.

Referring first to FIG. 10, a first page buffer PB1 connected to the first memory block BLK1 may include a p-type metal oxide semiconductor (PMOS) device PM1, first, second and third n-type metal oxide semiconductor (NMOS) devices NM1, NM2 and NM3, and latches LAT1, LAT2 and LAT3. The first memory block BLK1 may include a plurality of memory cells MC1-MCn, and the memory cells MC1-MCn may be connected to word lines WL1-WLn. The number of latches LAT1-LAT3 included in the first page buffer PB1 may vary according to an exemplary embodiment of the inventive concept, and the latches LAT1-LAT3 may be connected to a sensing node SO. For example, the number of the latches LAT1-LAT3 included in the first page buffer PB1 may vary depending on the number of bits of data stored in each of the memory cells MC1-MCn.

The first page buffer PB1 may be connected to the memory cells MC1-MCn of the first memory block BLK1 through the bit line BL. A string selection element and a ground selection element may be connected to both ends of the memory cells MC1-MCn in FIG. 10. In addition, a larger number of memory cells MC1-MCn, than illustrated in FIG. 10, may further be connected to the bit line BL connected to the first page buffer PB1.

In the reading operation, the first page buffer PB1 precharges the sensing node SO and the bit line BL, and inputs a predetermined bias voltage to the memory cells MC1-MCn to develop the sensing node SO, thereby reading the data of a selected memory cell $M_{SEL}$. For example, to precharge the sensing node SO and the bit line BL, a PMOS device PM1 is turned on by a load signal LOAD and thus, power voltage VDD may be input to the sensing node SO. In addition, the bit line BL may be precharged by turning on a first NMOS device NM1 and a second NMOS device NM2 by a bit line selection signal BLSLT and a control signal BLSHF. A third NMOS device NM3 may be turned on and discharge the bit line BL in response to a shield signal SHLD. Therefore, in the reading operation, the third NMOS device NM3 may be turned off.

When a precharging operation is completed, the PMOS device PM1 may be turned off. A pass voltage may be input to the remaining memory cells except for the selected memory cell $MC_{SEL}$, and a predetermined reading voltage may be input to the selected memory cell $MC_{SEL}$. The selected memory cell $MC_{SEL}$ may be determined to be an on-cell or an off-cell depending on the magnitude relationship between a threshold voltage and a reading voltage of the selected memory cell $MC_{SEL}$. The voltage of the sensing node SO is determined depending on the threshold voltage of the selected memory cell $MC_{SEL}$, and one of the latches LAT1 latches the voltage of the sensing node SO to read the data of the selected memory cell $MC_{SEL}$.

Two bits or more of data may be stored in each of the memory cells MC1-MCn of the first memory block BLK1 accessible in both the normal mode and the secure mode. Accordingly, the first page buffer PB1 may include a plurality of latches LAT1-LAT3. In the embodiment illustrated in FIG. 10, the memory cells MC1-MCn of the first memory block BLK1 may store data of three bits or more.

Referring to FIG. 11, the second page buffer PB2 may be connected to the second memory block BLK2 accessible only in the secure mode. The structure and operation of the second page buffer PB2 may be similar to the first page buffer PB1 described above with reference to FIG. 10.

On the other hand, the number of bits of data stored in each of the memory cells MC1-MCn of the second memory block BLK2 may be less than the number of bits of data stored in each of the memory cells MC1-MCn of the first memory block BLK1. Referring to FIG. 11, the second page buffer PB2 includes a first latch LAT1 and a second latch LAT2, so that each of the memory cells MC1-MCn of the second memory block BLK2 may store two bits or less of data. In an exemplary embodiment of the inventive concept, the number of latches included in the first page buffer PB1 connected to the first memory block BLK1 accessible in both the secure mode and the normal mode may be different from the number of latches included in the second page buffer PB2 connected to the second memory block BLK2 accessible only in the secure mode.

Figure 12:
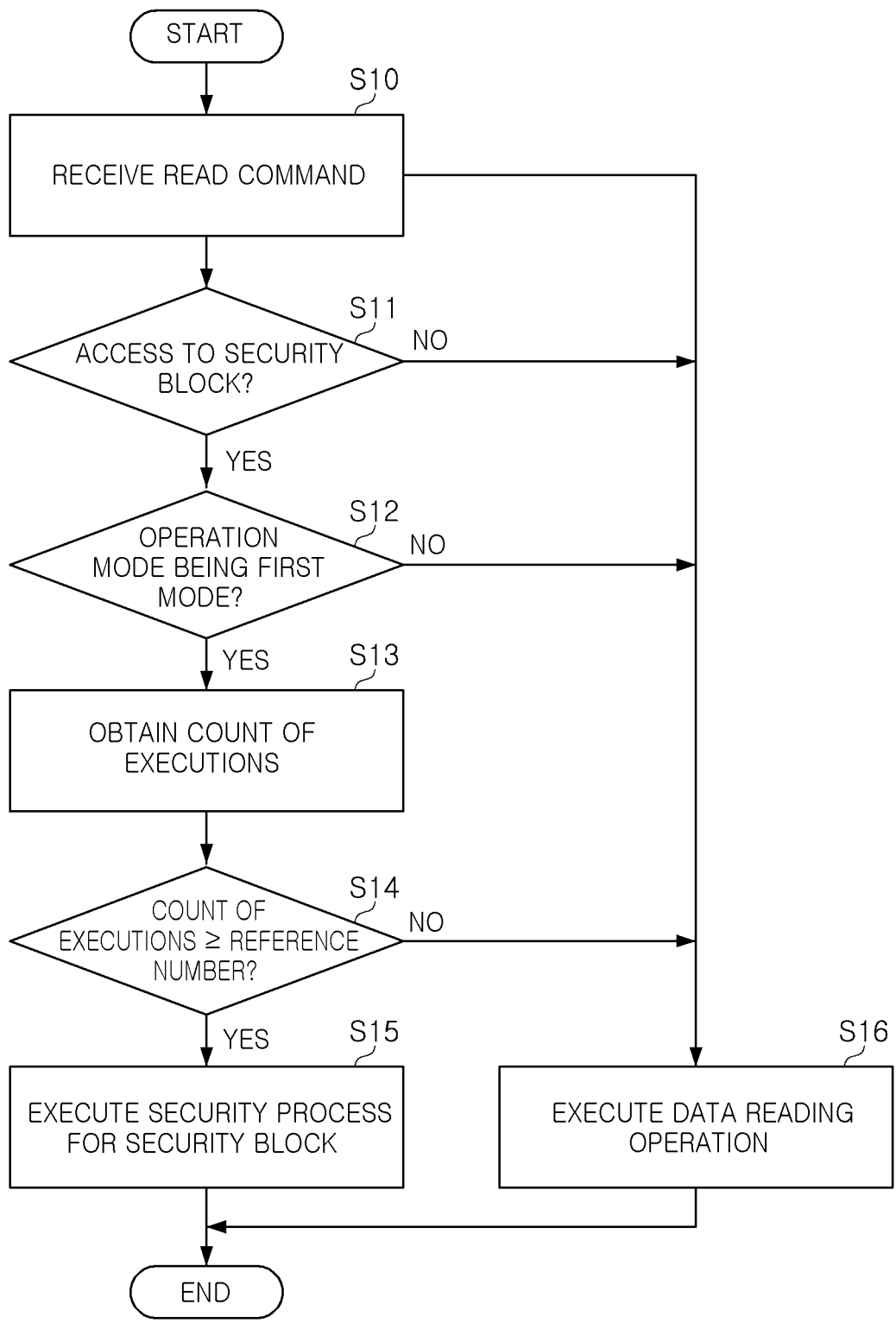
FIG. 12 is a flowchart provided to describe the operation of a memory device according to an exemplary embodiment of the inventive concept.

FIG. 12 is a flowchart provided to describe the operation of a memory device according to an exemplary embodiment of the inventive concept.

Referring to FIG. 12, the operation of the memory device may be started by the memory device receiving a read command (S10). The read command may be generated from a host and/or a memory controller connected to the memory device. The memory device may receive address information in which data to be read is provided together with a read command, and may determine whether the address information corresponds to a security block (S11).

When it is determined that the security block should be accessed by the read command, the memory device may determine whether the current operation mode is a first mode or a second mode (S12). As an example, the first mode may be a normal mode and may be an operation mode inaccessible to the security block. On the other hand, the second mode is a security mode, and may be an operation mode accessible to the security block. When the address information received together with the read command does not correspond to the security block, the memory device may execute a data reading operation (S16).

As a result of the determination in operation S12, when the current operation mode is not the first mode, for example, when the current operation mode is the second mode, the memory device may execute a data reading operation (S16). On the other hand, when the current operation mode is the first mode as a result of the determination in operation S12, the memory device may determine that an abnormal access to the security block has occurred in the first mode. In the first mode, the memory device counts the number of access times the control operation has been executed for the security block (S13), and determines whether the number of executions is counted up to a predetermined reference number or more (S14).

When the counted execution number is less than the reference number as a result of the determination in operation S14, the memory device may execute a data reading operation (S16). On the other hand, when it is determined in operation S14 that the counted execution number has increased to the reference number or more, the memory device may execute a security process for the security block (S15). The security process may include an operation of blocking access to the security block. As an example, the control logic of the memory device may delete data stored in the page buffer connected to the security block, or may set the page buffer to an unusable state. Alternatively, when the address information received together with the read command from the memory controller or the host corresponds to the security block, access to the security block may be blocked by stopping the operation of the row decoder and/or voltage generator. Alternatively, when the address information received together with the read command corresponds to the security block, the magnitude of the voltage output by the voltage generator may be changed, thereby preventing the normal operation from being executed.

Figure 13:
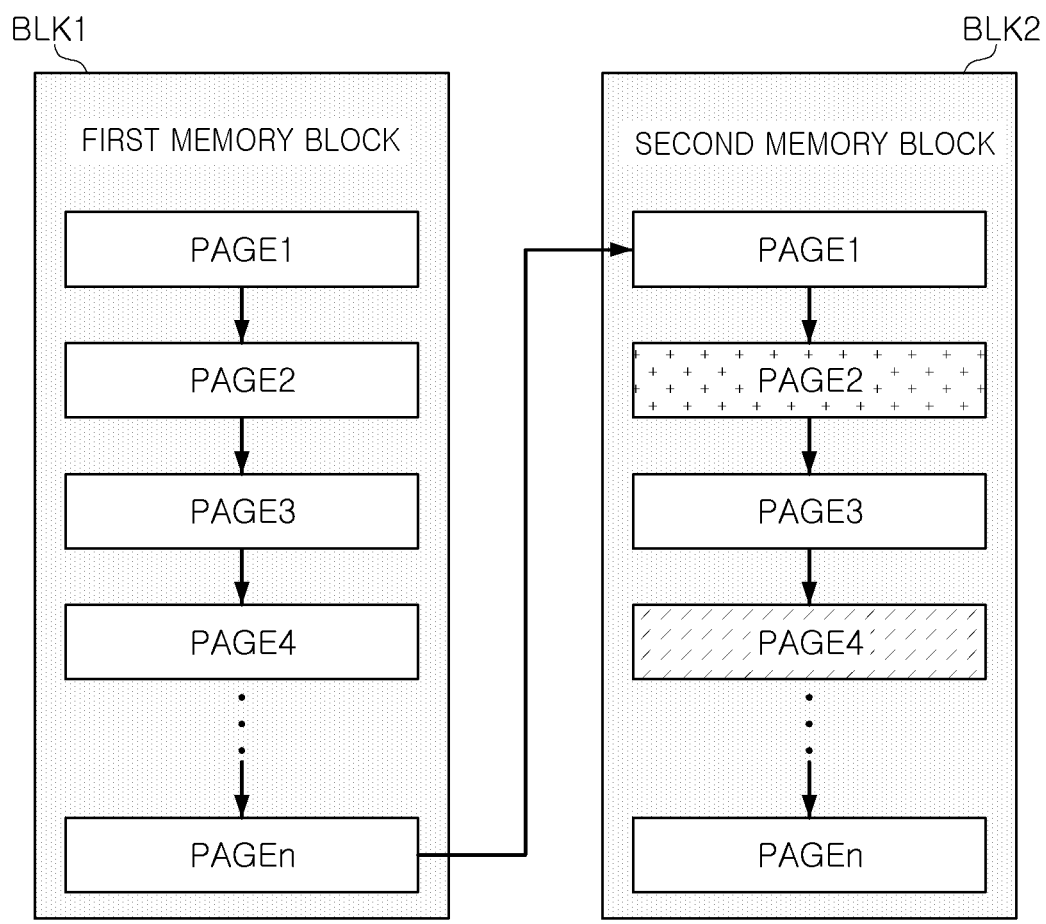
FIG. 13 is a diagram provided to describe the operation of a memory device according to an exemplary embodiment of the inventive concept.

FIG. 13 is a diagram provided to describe the operation of a memory device according to an exemplary embodiment of the inventive concept.

In the embodiment illustrated in FIG. 13, the memory device includes a first memory block BLK1 and a second memory block BLK2, and security data having high importance may be stored in the second memory block BLK2. Each of the first memory block BLK1 and the second memory block BLK2 may be a unit area in which an erase operation is executed in the memory device. In an example case, an attacker such as a hacker may scan the entire memory area including the first memory block BLK1 and the second memory block BLK2, and steal the security data stored in the second memory block BLK2 by analyzing the data pattern.

In an exemplary embodiment of the present inventive concept, when the access to the second memory block BLK2 by the memory area scan as described above is detected, the number of access times the second memory block BLK2 is accessed is counted and stored in the second memory block BLK2 as scan data. For example, the number of abnormal accesses to the second memory block BLK2 in which the security data is stored may be counted and stored in the second memory block BLK2. Referring to FIG. 13, in the second memory block BLK2, security data may be stored in a second page PAGE2, and scan data may be stored in a fourth page PAGE4. In addition, as described above, when the number of access times stored in the scan data increases to a predetermined reference number, a security process that blocks access to the second memory block BLK2 may be executed.

On the other hand, the attack on the second memory block BLK2 may be attempted again even when the security process is executed. For example, an attacker, such as a hacker, may initialize the scan data to release the security process and attempt to access the second memory block BLK2 again. In an exemplary embodiment of the present inventive concept, since the scan data is stored in the second memory block BLK2 together with the security data, when an attacker attempts to initialize the scan data, the security data may be deleted together with the scan data to prevent the security data from be obtained by the hacker.

Figure 14:
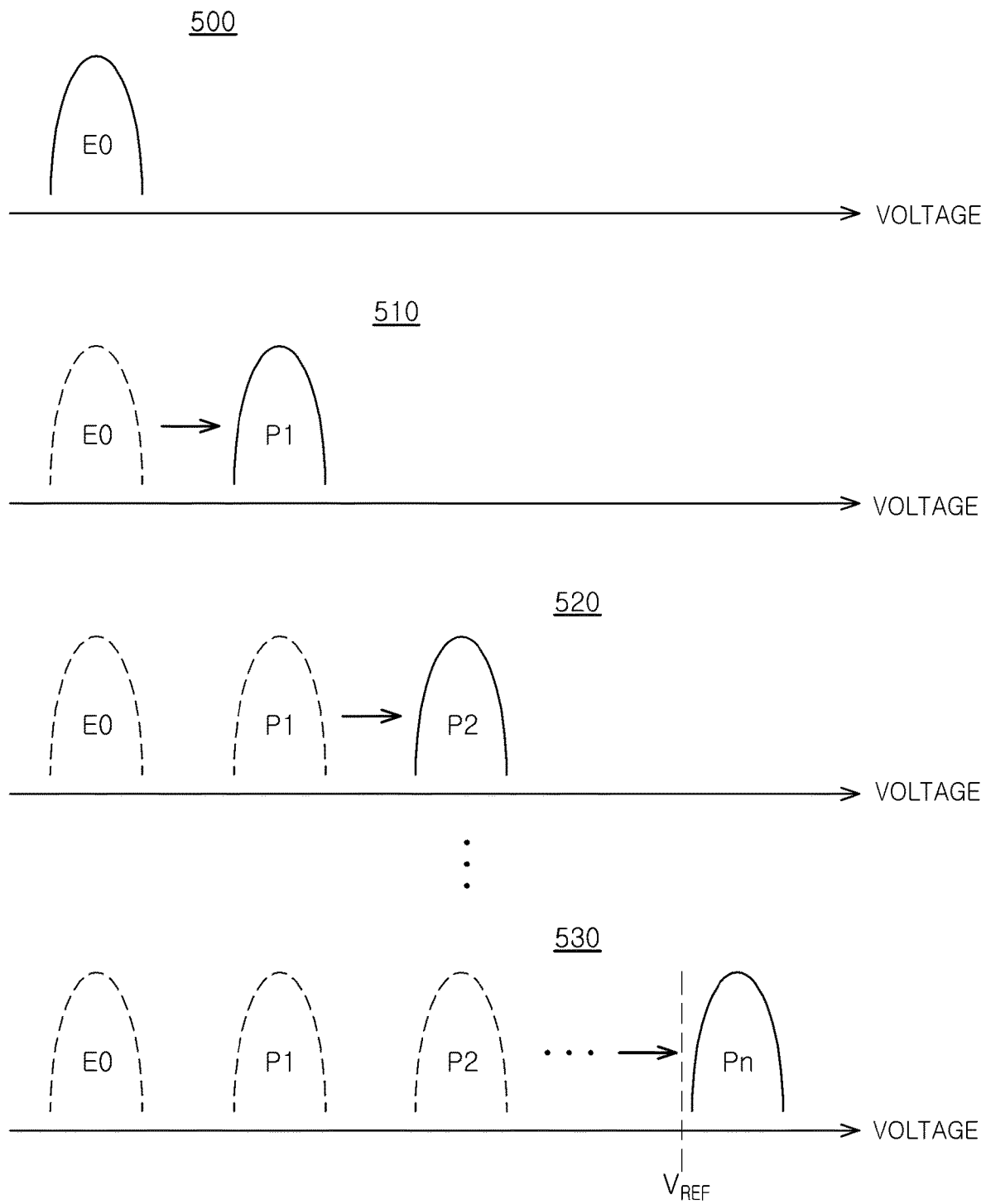
FIGS. 14 and 15 are diagrams provided to illustrate a method of storing scan data in a memory device according to an exemplary embodiment of the inventive concept.
Figure 15:
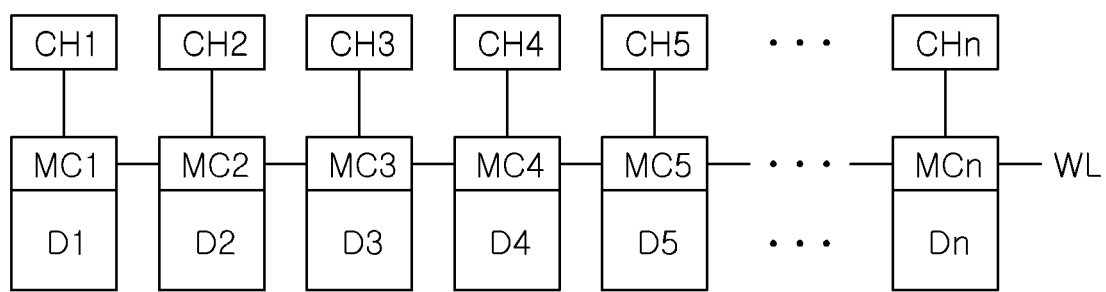

FIGS. 14 and 15 are diagrams provided to illustrate a method of storing scan data in a memory device according to exemplary embodiments of the inventive concept.

First, in the embodiment illustrated in FIG. 14, a memory device may store scan data in a manner of increasing a threshold voltage of a flag cell storing the scan data. Referring to FIG. 14, when the number of accesses to the security block is 0 in the normal mode, the flag cell may have an erase state (E0) as in a first graph 500. When the number of accesses to the security block in the normal mode is detected, as illustrated in a second graph 510, the memory device may increase the threshold voltage of the flag cell to transition from the erase state (E0) to a first program state (P1).

While the flag cell has the first program state P1, when access to the security block in the normal mode is detected again, the memory device may reprogram the flag cell so that the flag cell has a second program state P2 as illustrated in a third graph 520. When the access to the security block is detected n times in the normal mode, the flag cell may be programmed into an n-th program state Pn as in a fourth graph 530.

In the normal mode, when access to and/or attempt to access the security block occurs a predetermined reference number or more, the memory device may execute a security process that blocks access to the security block. For example, in the case in which the reference number is n, and when the threshold voltage of the flag cell is greater than a reference voltage $V_{REF}$ illustrated in the fourth graph 530, the memory device may determine that the number of accesses to the secure block in the normal mode is greater than or equal to the reference number. Accordingly, the memory device may compare the threshold voltage of the flag cell with the reference voltage $V_{REF}$ and execute a security process when the threshold voltage of the flag cell is greater than the reference voltage $V_{REF}$.

In the embodiment described with reference to FIG. 14, there may be two or more flag cells. The memory device may execute a security process when the threshold voltage of each of the two or more flag cells is greater than the reference voltage $V_{REF}$. According to exemplary embodiments of the inventive concept, different reference voltages $V_{REF}$ may also be applied to at least some of the two or more flag cells.

In the embodiment illustrated in FIG. 15, scan data D1-Dn may be distributed and stored in a plurality of flag cells MC1-MCn connected to one word line WL. In an exemplary embodiment of the inventive concept, each of the flag cells MC1-MCn may be provided by different channel regions CH1-CHn.

In the embodiment illustrated in FIG. 15, when each of the flag cells MC1-MCn stores 1-bit data, the scan data D1-Dn may be n-bit data. In addition, when each of the flag cells MC1-MCn stores 2-bit data, the scan data D1-Dn may be 2-n-bit data. The memory device may generate scan data D1-Dn by merging data read from the respective flag cells MC1-MCn.

In an example, the scan data D1-Dn may be distributed and stored in the flag cells MC1-MCn in the form of a bit format. The number of abnormal accesses to the security block stored in the scan data D1-Dn may be set as $2^n$ at maximum. The data stored in each of the flag cells MC1-MCn and the number of counts of abnormal access times for the security block may be set as illustrated in Table 1 below. For convenience of description, Table 1 illustrates a case in which the number of flag cells MC1-MCn storing scan data is six.

TABLE 1

| Number of Counts | D1 | D2 | D3 | D4 | D5 | D6 |
|---|---|---|---|---|---|---|
| 0 | 0 | 0 | 0 | 0 | 0 | 0 |
| 1 | 1 | 0 | 0 | 0 | 0 | 0 |
| 2 | 0 | 1 | 0 | 0 | 0 | 0 |
| 3 | 1 | 1 | 0 | 0 | 0 | 0 |
| ... | ... | ... | ... | ... | ... | ... |
| 63 | 1 | 1 | 1 | 1 | 1 | 1 |

In an exemplary embodiment of the inventive concept described with reference to Table 1, the number of abnormal accesses generated for the security block may be counted up to 32 times and may be stored in flag cells as scan data. However, the reference number at which the memory device executes the security process for the security block is not necessarily limited to 32, which is a maximum number of times that may be stored, and the reference number may be variously defined.

Figure 16:
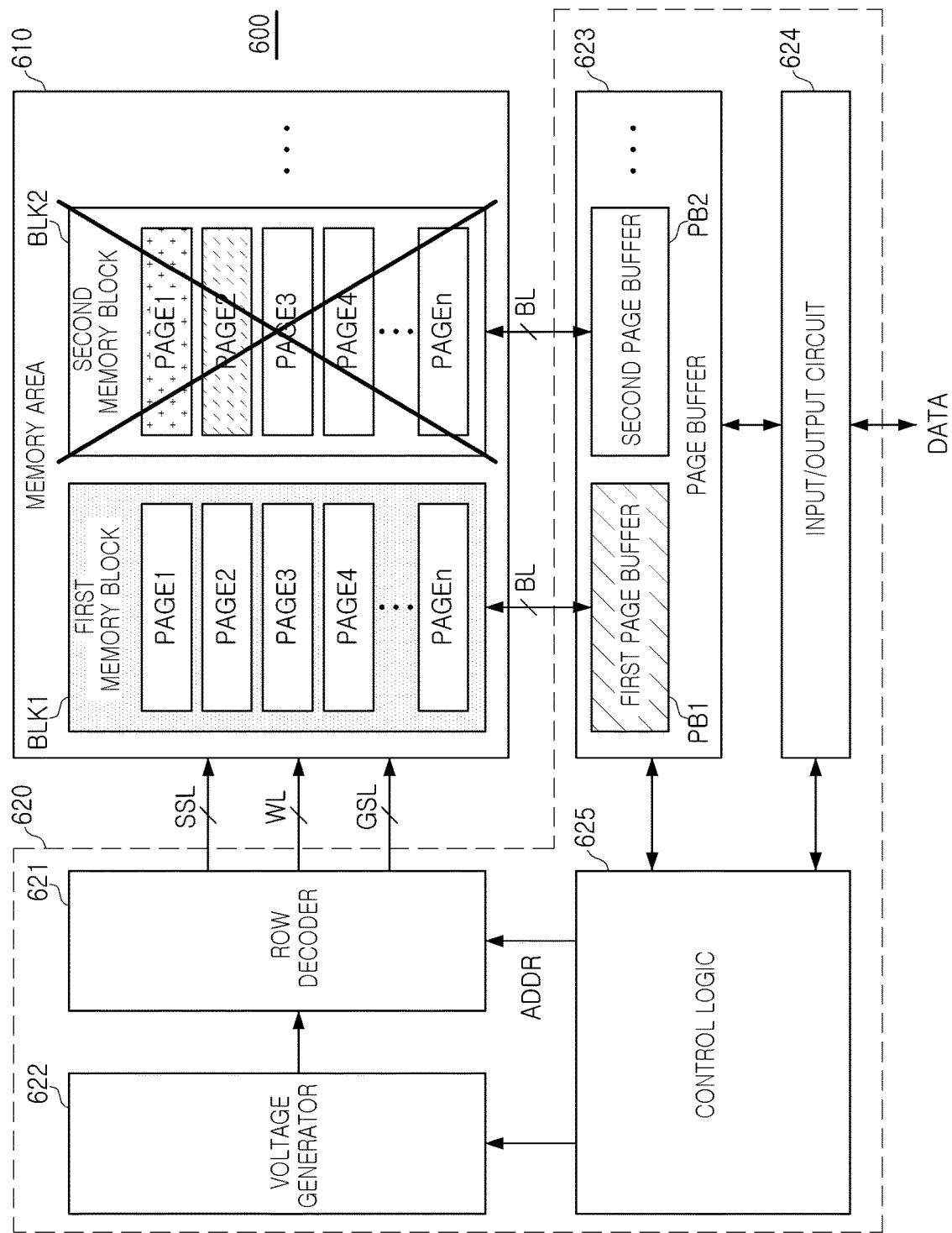
FIGS. 16 and 17 are diagrams provided to illustrate the operation of a memory device according to an exemplary embodiment of the inventive concept.
Figure 17:
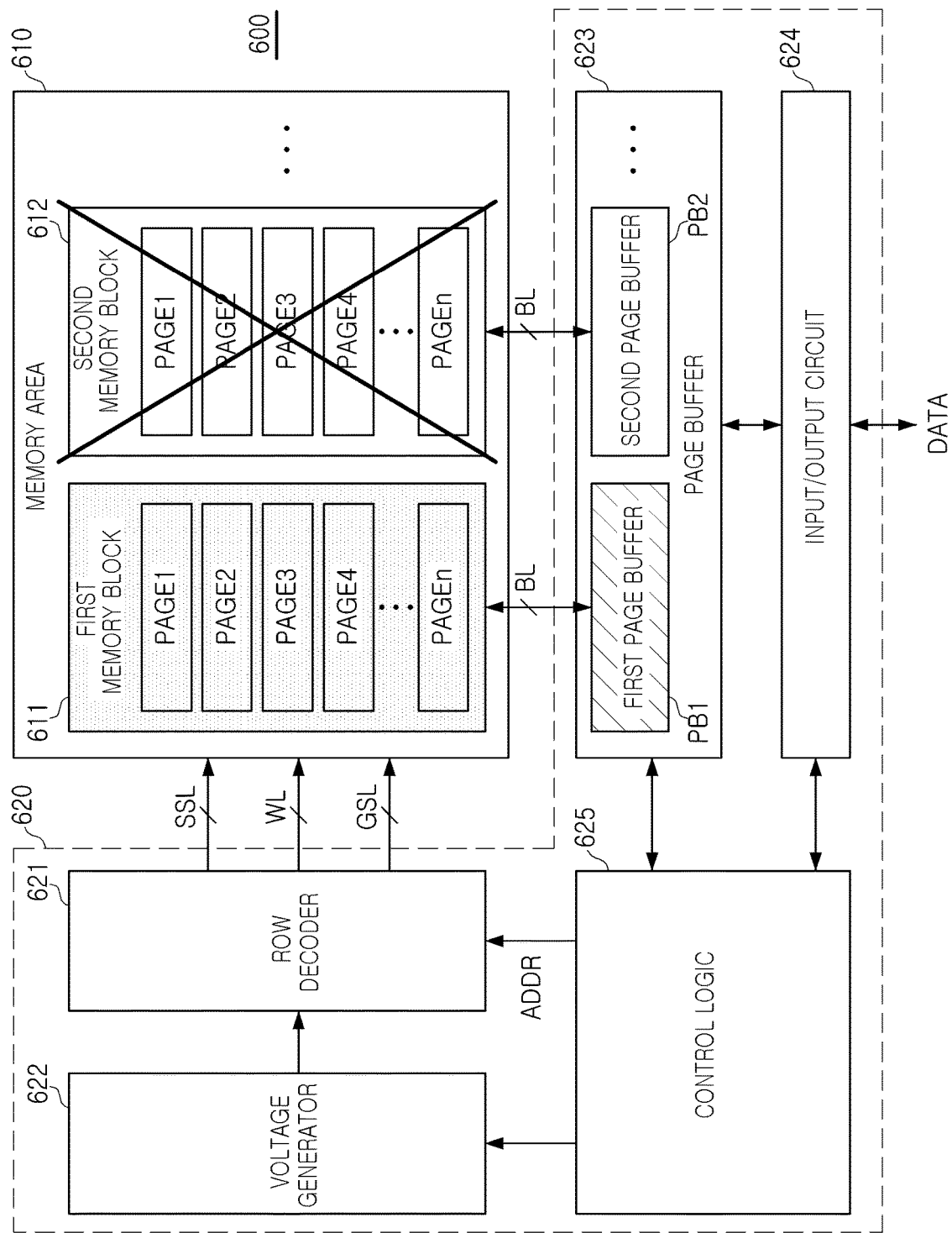

FIGS. 16 and 17 are diagrams provided to illustrate the operation of a memory device according to an exemplary embodiment of the inventive concept.

In the embodiment illustrated in FIGS. 16 and 17, a memory device 600 may include a memory area 610 and a peripheral circuit 620. The peripheral circuit 620 may include a row decoder 621, a voltage generator 622, a page buffer 623, an input/output circuit 624, a control logic 625 and the like. The operation of components 621-625 included in the peripheral circuit 620 may be similar to those described with reference to FIGS. 2 and 7 to 9 above. For example, the memory device 600 may operate in one of the first mode and the second mode, and may only access the first memory block BLK1 in the first mode, and may only access the second memory block BLK2 in the second mode.

Referring to FIG. 16, the number of access times the control operation is executed for the second memory block BLK2 in the first mode is increased to a predetermined reference number or more, and thus, the control logic 625 may execute a security process for the second memory block BLK2. Therefore, as illustrated in FIG. 16, access to the second memory block BLK2 may be blocked. The control logic 625 may block the access to the second memory block BLK2 by controlling at least one of the row decoder 621, the voltage generator 622, and the second page buffer PB2.

In an exemplary embodiment of the inventive concept, the number of executions of the control operation for the second memory block BLK2 in the first mode may be stored in the second memory block BLK2 as scan data. In the embodiment illustrated in FIG. 16, the scan data is stored in the second page PAGE2 of the second memory block BLK2, and the security data may be stored in the first page PAGE1 of the second memory block BLK2.

In an exemplary embodiment of the inventive concept, when the scan data is initialized, the control logic 625 may release the security process executed for the second memory block BLK2. For example, when a predetermined authentication process provided by the memory device 600 passes, the control logic 625 reprograms the number of accesses included in the scan data to zero to release the security process for the second memory block BLK2.

However, an attempt to initialize the scan data and release the security process may be performed by an attacker, such as a hacker, forcibly deleting the scan data. In this case, in an exemplary embodiment of the present inventive concept, since the scan data is stored in the same second memory block BLK2 as that of the security data, security data may be deleted together as illustrated in FIG. 17 when the attacker deletes the scan data. Therefore, the leakage of security data may be prevented.

Figure 18:
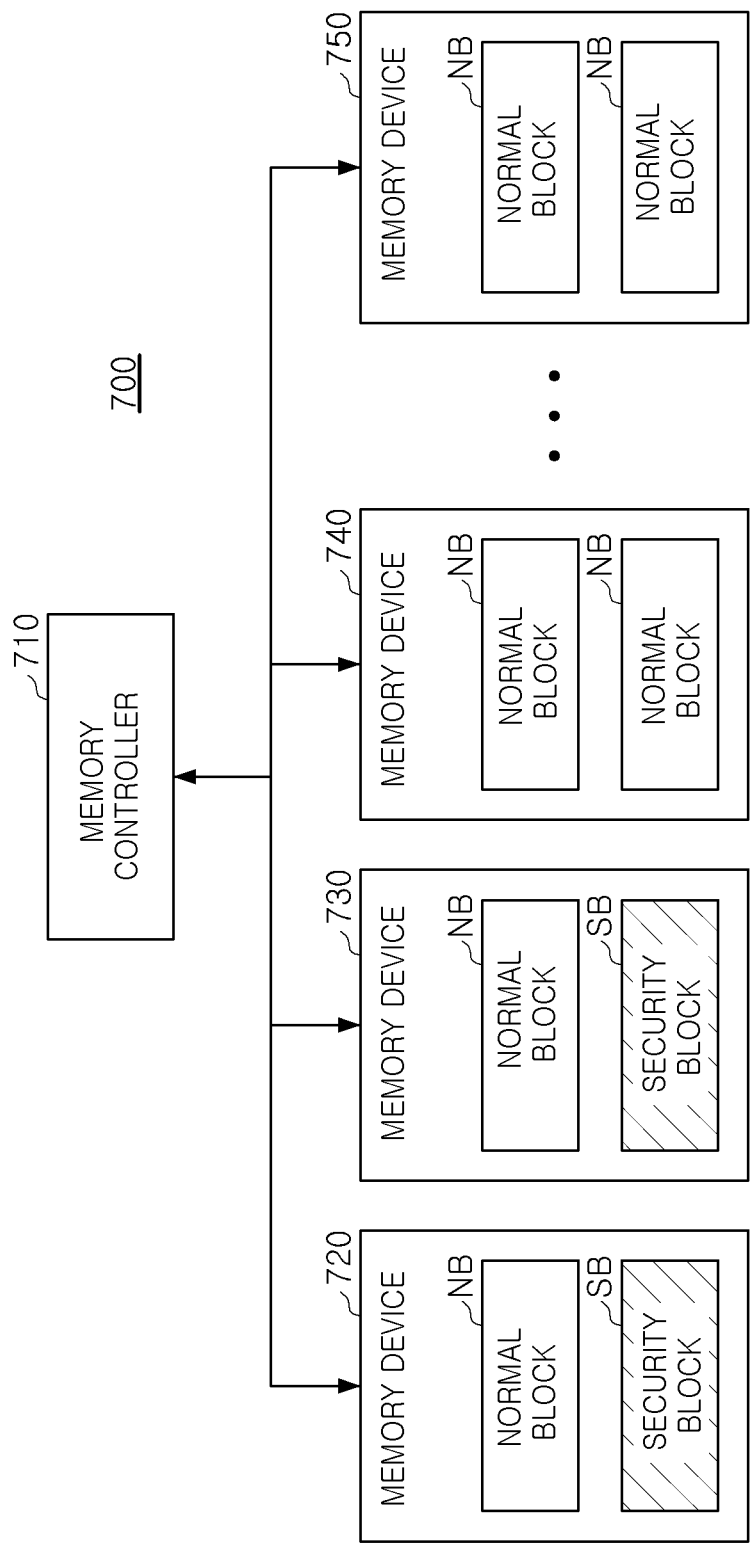
FIG. 18 is a diagram schematically illustrating a memory system according to an exemplary embodiment of the inventive concept.

FIG. 18 is a diagram schematically illustrating a memory system according to an exemplary embodiment of the inventive concept.

Referring to FIG. 18, a memory system 700 according to an exemplary embodiment of the inventive concept may include a memory controller 710 and a plurality of memory devices 720-750. The memory controller 710 may communicate with a host to which the memory system 700 is connected, and may control the memory devices 720-750 in response to a control command received from the host.

The memory devices 720-750 may be implemented respectively with separate semiconductor chips. In the embodiment illustrated in FIG. 18, at least a portion of the memory devices 720-750 may include a normal block NB and a security block SB. When the memory system 700 operates in the normal mode, only the normal block NB is activated, and access to the security block SB may not be possible in a normal manner. However, by scanning all of the normal and security blocks NB and SB included in the memory devices 720-750 and analyzing the data pattern, the security data stored in the security block SB may be accessed in the normal mode by a hacker.

According to exemplary embodiments of the present inventive concept, the number of access times the data stored in the security block SB is accessed in the normal mode may be counted, and the counted number of access times may be stored in the security block SB as scan data. The operation of counting the number of accesses to the security block SB in the normal mode and storing the number of accesses as scan data in the security block SB may be executed by the control logic included in each of the memory controller 710 and/or the memory devices 720-750. For example, each of the memory devices 720-750 may count and maintain its own number of access times. Therefore, the case in which an attacker, such as a hacker, detaches a specific device among the memory devices 720-750, skips the memory controller 710, and immediately accesses the security block SB, this immediate access may also be counted and stored as scan data, thereby effectively protecting the security data stored in the security block SB.

Figure 19:
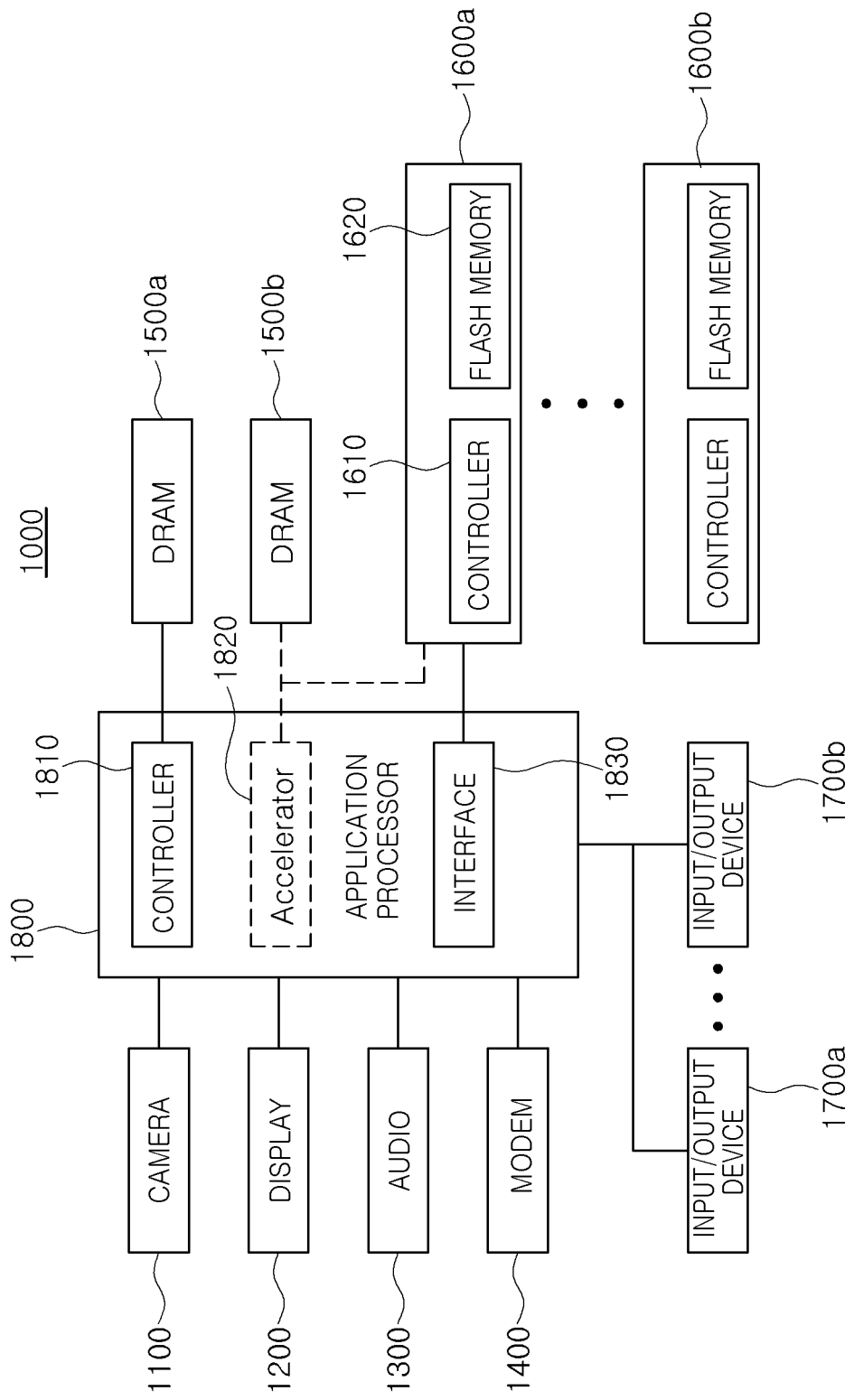
FIG. 19 is a diagram schematically illustrating a mobile system including a memory device according to an exemplary embodiment of the inventive concept.

FIG. 19 is a diagram schematically illustrating a mobile system including a memory device according to an exemplary embodiment of the inventive concept.

Referring to FIG. 19, a mobile system 1000 may include a camera 1100, a display 1200, an audio processor 1300, a modem 1400, dynamic random access memories (DRAMs) 1500a and 1500b, flash memory devices 1600a and 1600b, input/output devices 1700a and 1700b, and an application processor (hereinafter referred to as "AP") 1800.

The mobile system 1000 may be implemented as a laptop computer, a portable terminal, a smart phone, a tablet PC, a wearable device, a healthcare device, or an Internet-of-Things (IoT) device. In addition, the mobile system 1000 may be implemented as a server or a personal computer.

The camera 1100 may take a still image or a video according to a user's control. The mobile system 1000 may acquire specific information using a still image/video captured by the camera 1100 or convert the still image/video into other types of data such as text and store the data. Alternatively, the mobile system 1000 may recognize a character string included in a still image/video photographed with the camera 1100 and provide a text or audio translation corresponding to the character string. As such, the field of use of the camera 1100 in the mobile system 1000 is diversified. In an exemplary embodiment of the inventive concept, the camera 1100 may transmit data such as a still image/video to the AP 1800 according to a D-Phy or C-Phy interface according to the MIPI standard.

The display 1200 may be implemented in various forms such as a liquid crystal display (LCD), an organic light emitting diode (OLED) display, an active-matrix organic light-emitting diode (AM-OLED), a plasma display panel (PDP), a field emission display (FED), electronic paper or the like. In an exemplary embodiment of the inventive concept, the display 1200 may also be used as an input device of the mobile system 1000 by providing a touch screen function. In addition, the display 1200 may be provided integrally with a fingerprint sensor or the like to provide a security function of the mobile system 1000. In an exemplary embodiment of the inventive concept, the AP 1800 may transmit image data to be displayed on the display 1200, to the display 1200, according to a D-Phy or C-Phy interface based on the MIPI standard.

The audio processor 1300 may process audio data stored in the flash memory devices 1600a and 1600b or audio data included in content received externally through the modem 1400 or the input/output devices 1700a and 1700b. For example, the audio processor 1300 may perform various processes such as coding/decoding, amplification, and noise filtering for audio data.

The modem 1400 modulates and transmits signals to transmit/receive wired/wireless data, and demodulates signals received from the outside to restore the original signal. The input/output devices 1700a and 1700b are devices that provide digital input/output, and may include a portion connected to an external recording medium, an input device such as a touch screen, a mechanical button key or the like, an output device outputting vibrations in a haptic or other schemes, and the like. In some examples, the input/output devices 1700a and 1700b may be connected to an external recording medium through ports such as universal serial bus (USB), lightning cable, secure digital (SD) card, micro SD card, digital video disc (DVD), network adapter, or the like.

The AP 1800 may control the overall operation of the mobile system 1000. For example, the AP 1800 may control the display 1200 such that a part of the contents stored in the flash memory devices 1600a and 1600b is displayed on the screen. In addition, when the user input is received through the input/output devices 1700a and 1700b, the AP 1800 may perform a control operation corresponding to the user input.

The AP 1800 may be provided as a system-on-chip (SoC) driving an application program, an operating system (OS), or the like. In addition, the AP 1800 may be included in one semiconductor package along with other devices included in the mobile system 1000, for example, the DRAM 1500a, a flash memory 1620, and/or a memory controller 1610. For example, the AP 1800 and at least one or more devices may be provided in the form of a package, such as Package on Package (PoP), Ball grid arrays (BGAs), Chip scale packages (CSPs), System In Package (SIP), Multi Chip Package (MCP), Wafer-level Fabricated Package (WFP), Wafer-Level Processed Stack Package (WSP), or the like. The kernel of the operating system running on the AP 1800 may include a device driver for controlling the flash memory devices 1600a and 1600b and an input/output scheduler. The device driver may control the access performance of flash memory devices 1600a and 1600b by referring to the number of synchronous queues managed by the input/output scheduler, or control the CPU mode inside the SoC, Dynamic Voltage and Frequency Scaling (DVFS) level, or the like.

In an exemplary embodiment of the inventive concept, the AP 1800 may include a processor block that executes an operation or drives an application program and/or an operating system, and various other peripheral components connected to a processor block through a system bus. Peripheral components may include a memory controller, internal memory, a power management block, an error detection block, a monitoring block and the like. The processor block may include one or more cores, and in the case in which a plurality of cores are included in the processor block, each of the cores includes a cache memory, and a common cache shared by the cores may be included in the processor block.

In an exemplary embodiment of the inventive concept, the AP 1800 may also include an Accelerator block 1820 that is a dedicated circuit for artificial intelligence (AI) data computation. Alternatively, according to exemplary embodiments of the inventive concept, a separate accelerator chip may be provided separately from the AP 1800, and the DRAM 1500b may be additionally connected to the accelerator block 1820 or the accelerator chip. The accelerator block 1820 is a function block that performs a specific function of the AP 1800, and includes a Graphics Processing Unit (GPU) that is a functional block and specializes in processing graphic data, a Neural Processing Unit (NPU) which is a block for performing AI calculation and inference, a Data Processing Unit (DPU) which is a block specializing in data transmission, and the like.

According to an exemplary embodiment of the inventive concept, the mobile system 1000 may include a plurality of DRAMs 1500a and 1500b, In an exemplary embodiment of the inventive concept, the AP 1800 may include a controller 1810 for controlling the DRAMs 1500a and 1500b, and the DRAM 1500a may be directly connected to the AP 1800.

The AP 1800 controls the DRAMs 1500a and 1500b by setting commands and a Mode Register Set (MRS) conforming to the JEDEC standard, or may perform communications by setting specifications and functions, such as low voltage/high speed/reliability, required by the mobile system 1000 and a DRAM interface protocol for CRC/ECC. For example, the AP 1800 may communicate with the DRAM 1500a through an interface conforming to JEDEC standards such as LPDDR4, LPDDR5 or the like. Alternatively, the AP 1800 may set a new DRAM interface protocol to control the DRAM 1500b for an accelerator, having a higher bandwidth than that of the DRAM 1500a, by the accelerator block 1820 or an accelerator chip provided separately from the AP 1800, thereby enabling communications to be performed.

Although only DRAMs 1500a and 1500b are illustrated in FIG. 19, the configuration of the mobile system 1000 is not necessarily limited to this type, an memories other than DRAMs 1500a and 1500b may also be included in the mobile system 1000 depending on the bandwidth, response speed, and voltage conditions of the AP 1800 or the accelerator block 1820. In an example, the controller 1810 and/or the accelerator block 1820 may control various memories such as phase change RAM (PRAM), static RAM (SRAM), magnetic RAM (MRAM), resistive RAM (RRAM), ferroelectric RAM (FRAM), Hybrid RAM, and the like. The DRAMs 1500a and 1500b have relatively low latency and high bandwidth than the input/output devices 1700a and 1700b or the flash memory devices 1600a and 1600b. The DRAMs 1500a and 1500b may be initialized at the power-on time point of the mobile system 1000, and when the operating system and application data are loaded, the DRAMs 1500a and 1500b may be used as temporary storage locations for the operating system and application data or as execution spaces for various software codes.

In the DRAMs 1500a and 1500b, addition/subtraction/multiplication/dividing arithmetic operations and vector operations, address operations, or fast Fourier transform (FFT) operations data may be stored. In another embodiment, the DRAMs 1500a and 1500b may be provided as a processing-in-memory (PIM) equipped with a calculation function. For example, a function for performing a function used for inference in the DRAMs 1500a and 1500b may be performed. In this case, the inference may be performed in a deep learning algorithm using an artificial neural network. The deep learning algorithm may include a training operation of training a model through various data and an inference operation of recognizing data with the trained model. For example, the function used for the inference may include a hyperbolic tangent function, a sigmoid function, and a rectified linear unit (ReLU) function.

In an exemplary embodiment of the inventive concept, an image captured by the user through the camera 1100 may be signal-processed and stored in the DRAM 1500b, and the accelerator block 1820 or accelerator chip may perform an AI data operation of recognizing data using data stored in the DRAM 1500b and the function used for inference.

According to an exemplary embodiment of the inventive concept, the mobile system 1000 may include a plurality of storage devices or a plurality of flash memory devices 1600a and 1600b having a larger capacity than the DRAMs 1500a and 1500b. The flash memory devices 1600a and 1600b may include the memory controller 1610 and the flash memory 1620. The memory controller 1610 receives control commands and data from the AP 1800, writes data to the flash memory 1620 in response to the control command, or reads data stored in the flash memory 1620 to access the AP 1800 and may transmit the data to the AP 1800.

According to an exemplary embodiment of the inventive concept, the accelerator block 1820 or the accelerator chip may perform training operations and an AI data calculation using the flash memory devices 1600a and 1600b. In an exemplary embodiment of the inventive concept, operation logic capable of executing a predetermined operation inside the flash memory devices 1600a and 1600b may be implemented in the controller 1610, and the operation logic may execute at least a portion of the training operations and the operation of the inference AI data performed by the AP 1800 and/or the accelerator block 1820, in place, using the data stored in the flash memory 1620.

In an exemplary embodiment of the inventive concept, the AP 1800 may include an interface 1830, and accordingly, the flash memory devices 1600a and 1600b may be directly connected to the AP 1800. For example, the AP 1800 may be implemented as a SoC, the flash memory device 1600a may be implemented as a separate chip from the AP 1800, and the AP 1800 and the flash memory device 1600a may be mounted in one package. However, the inventive concept is not limited thereto, and the plurality of flash memory devices 1600a and 1600b may be electrically connected to the mobile system 1000 through a connection.

The flash memory devices 1600a and 1600b may store data such as still images/movies taken by the camera 1100, or may store data received through a communication network and/or ports included in the input/output devices 1700a and 1700b, and for example, may store Augmented Reality/Virtual Reality, High Definition (HD), or Ultra High Definition (UHD) contents.

In an exemplary embodiment of the inventive concept illustrated in FIG. 19, the flash memory devices 1600a and 1600b may be implemented as a memory device or a memory system according to the embodiments described with reference to FIGS. 1 to 18 above. Since the flash memory devices 1600a and 1600b have non-volatile characteristics, security data such as a security key and a private key required for operation of at least one of the mobile system 1000 and components thereof may be stored. At least one of the flash memory devices 1600a and 1600b may include a security block for storing security data. In the security block, scan data obtained by counting abnormal access times to the security data may be stored together with the security data.

When the number of accesses stored in the scan data is greater than or equal to a predetermined reference number, the flash memory devices 1600a and 1600b may block access to the security block. In addition, since the scan data is stored in the security block together with the security data, when the initialization of the scan data is attempted, the security data is deleted together to prevent leakage of the security data.

Figure 20:
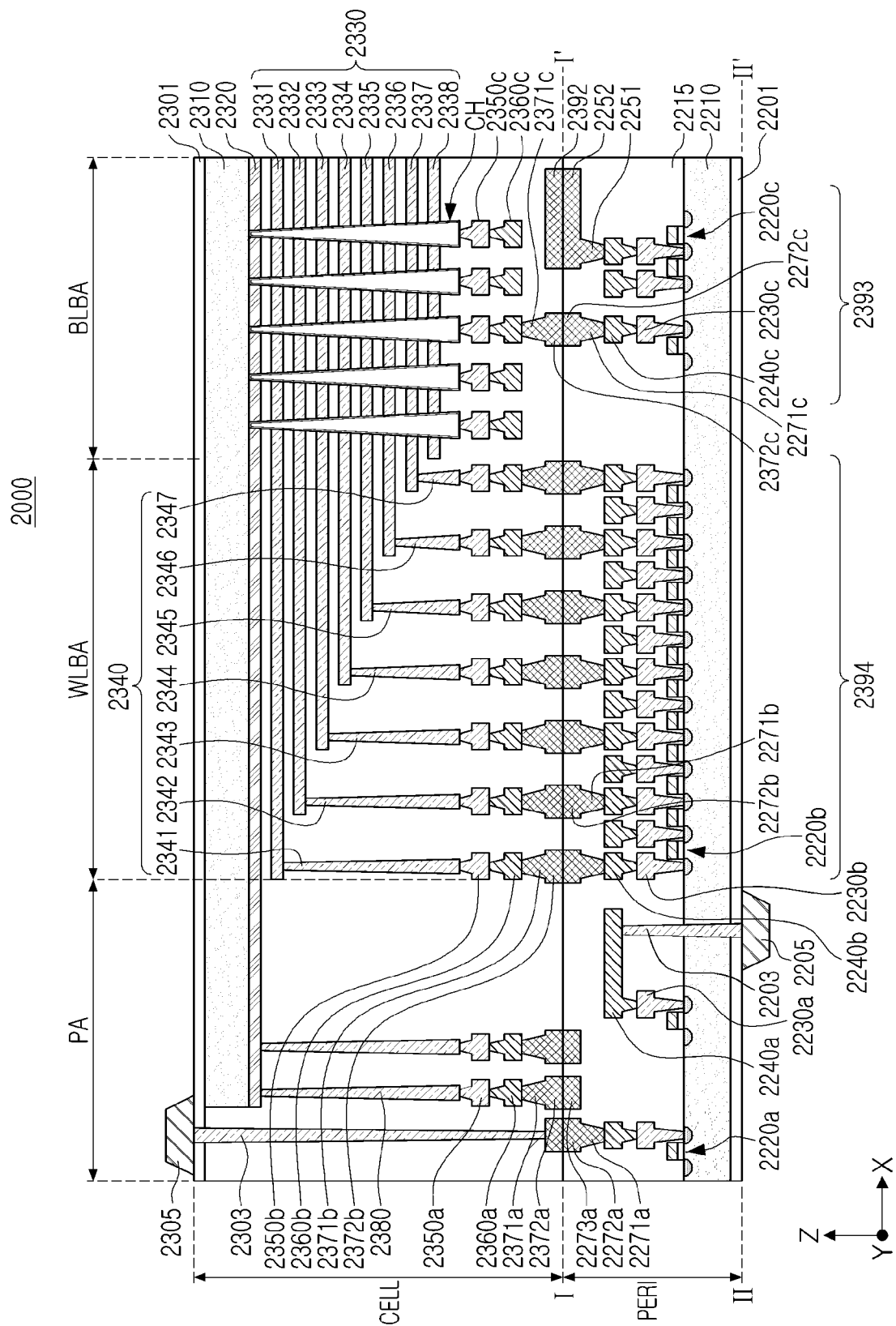
FIG. 20 is a view schematically illustrating a structure of a memory device according to an exemplary embodiment of the inventive concept.

FIG. 20 is a view schematically illustrating a structure of a memory device according to an exemplary embodiment of the inventive concept.

Referring to FIG. 20, a memory device 2000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals are formed of copper (Cu), the bonding manner may be a Cu—Cu bonding, and the bonding metals may also be formed of aluminum or tungsten.

Each of the peripheral circuit region PERI and the cell region CELL of the memory device 2000 may include an external pad bonding area PA, a word line bonding area WLBA, and a bit line bonding area BLBA. The cell region CELL may include a plurality of memory blocks having a first memory block and a second memory block, and the peripheral circuit region PERI may include circuits to drive the plurality of memory blocks in the cell region CELL. In an exemplary embodiment of the inventive concept, a control logic may be included in the peripheral circuit region PERI. The control logic may select one of a first mode and a second mode. The control logic may execute a control operation for the first memory block in the first mode, and execute control operations for the first block and the second block in the second mode. In addition, the control logic may count the number of access times the second memory block has been accessed in the first mode, and store scan data including the number of access times, in the second memory block. When attempting to initialize the scan data, a security data stored in the second memory block may also be deleted, therefore, security of the memory device 2000 can be improved.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an exemplary embodiment of the inventive concept, the first metal layers 2230a, 2230b, and 2230c may be formed of tungsten having relatively high resistance, and the second metal layers 2240a, 2240b, and 2240c may be formed of copper having relatively low resistivity.

In an exemplary embodiment of the inventive concept illustrated in FIG. 20, although the first metal layers 2230a, 2230b, and 2230c and the second metal layers 2240a, 2240b, and 2240c are shown and described, they are not limited thereto, and one or more metal layers may be further formed on the second metal layers 2240a, 2240b, and 2240c. At least a portion of the one or more metal layers formed on the second metal layers 2240a, 2240b, and 2240c may be formed of aluminum or the like different from copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically connected to upper bonding metals 2371b and 2372b in the cell region CELL in a bonding manner, and the lower bonding metals 2271b and 2272b and the upper bonding metals 2371b and 2372b may be formed of aluminum, copper, tungsten, or the like.

The cell region CELL may include at least one memory block. The cell region CELL may include a second substrate 2310 and a common source line 2320. On the second substrate 2310, a plurality of word lines 2331 to 2338 (e.g., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line.

In the bit line bonding area BLBA, a channel structure CH may extend in a direction, perpendicular to the upper surface of the second substrate 2310, and pass through the plurality of word lines 2330, the at least one string select line, and the at least one ground select line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an exemplary embodiment of the inventive concept, the bit line 2360c may extend in a first direction (a Y-axis direction), parallel to the upper surface of the second substrate 2310.

In the embodiment illustrated in FIG. 20, an area in which the channel structure CH, the bit line 2360c, and the like are disposed may be the bit line bonding area BLBA. In the bit line bonding area BLBA, the bit line 2360c may be electrically connected to the circuit elements 2220c providing a page buffer 2393 in the peripheral circuit region PERI. For example, the bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a second direction (an X-axis direction), parallel to the upper surface of the second substrate 2310, and may be connected to a plurality of cell contact plugs 2341 to 2347 (e.g., 2340). The plurality of word lines 2330 and the plurality of cell contact plugs 2340 may be connected to each other in pads provided by at least a portion of the plurality of word lines 2330 extending in different lengths in the second direction. A first metal layer 2350b and a second metal layer 2360b may be connected to an upper portion of the plurality of cell contact plugs 2340 connected to the plurality of word lines 2330, sequentially. The plurality of cell contact plugs 2340 may be connected to the circuit region PERI by the upper bonding metals 2371b and 2372b of the cell region CELL and the lower bonding metals 2271b and 2272b of the peripheral circuit region PERI in the word line bonding area WLBA.

The plurality of cell contact plugs 2340 may be electrically connected to the circuit elements 2220b providing a row decoder 2394 in the peripheral circuit region PERI. In an exemplary embodiment of the inventive concept, operating voltages of the circuit elements 2220b providing the row decoder 2394 may be different than operating voltages of the circuit elements 2220c providing the page buffer 2393. For example, operating voltages of the circuit elements 2220c providing the page buffer 2393 may be greater than operating voltages of the circuit elements 2220b providing the row decoder 2394.

A common source line contact plug 2380 may be disposed in the external pad bonding area PA. Also, lower bonding metals 2271a and 2272a may be disposed in the external bonding area PA of the cell region CELL, and upper bonding metals 2371a and 2372a may be disposed in the external bonding area PA of the peripheral circuit regions PERI. In the external pad bonding area PA, the lower bonding metals 2271a and 2272a may be electrically connected to the upper bonding metals 2371a and 2372a in a bonding manner. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be the external pad bonding area PA.

Input-output pads 2205 and 2305 may be disposed in the external pad bonding area PA. Referring to FIG. 20, a lower insulating film 2201 covering a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220a, 2220b, and 2220c disposed in the peripheral circuit region PERI through a first input-output contact plug 2203, and may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 20, an upper insulating film 2301 covering the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220a, 2220b, and 2220c disposed in the peripheral circuit region PERI through a second input-output contact plug 2303.

According to exemplary embodiments of the inventive concept, the second substrate 2310 and the common source line 2320 may not be disposed in an area in which the second input-output contact plug 2303 is disposed. In addition, the second input-output pad 2305 may not overlap the word lines 2330 in the third direction (the Z-axis direction). Referring to FIG. 20, the second input-output contact plug 2303 may be separated from the second substrate 2310 in a direction, parallel to the upper surface of the second substrate 2310, and may pass through the interlayer insulating layer 2315 of the cell region CELL to be connected to the second input-output pad 2305.

According to exemplary embodiments of the inventive concept, the first input-output pad 2205 and the second input-output pad 2305 may be selectively formed. For example, the memory device 2000 may include only the first input-output pad 2205 disposed on the first substrate 2210 or the second input-output pad 2305 disposed on the second substrate 2310. Alternatively, the memory device 2000 may include both the first input-output pad 2205 and the second input-output pad 2305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same shape as the upper metal pattern 2372a of the cell region CELL, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by a Cu—Cu bonding.

Further, the bit line bonding area BLBA, an upper metal pattern 2392, corresponding to lower metal patterns 2251 and 2252 formed in the uppermost metal layer of the peripheral circuit region PERI, and having the same shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an exemplary embodiment of the inventive concept, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

As set forth above, according to an exemplary embodiment of the inventive concept, a control logic of a memory device selects one of a first mode and a second mode to control a memory area. The memory area may include a first memory block accessible in a first mode and a second mode, and a second memory block accessible only in the second mode and storing security data. When access to the second memory block is sensed in the first mode, the control logic may store the number of times the second memory block is attempted to be accessed in the second memory block. When attempting to initialize the number of access attempts stored in the second memory block, security data is deleted together therewith, thereby providing a memory device having improved security performance.

While the present inventive concept has been illustrated and described with reference to exemplary embodiments thereof, it will be apparent to those skilled in the art that modifications and variations could be made thereto without departing from the scope of the present inventive concept as set forth by the appended claims.

What is claimed is:

1. A memory device, comprising:
a memory area having a first memory block and a second memory block; and
a control logic configured to control the first memory block and the second memory block in a first mode and a second mode, wherein in the first mode only a control operation for the first memory block is executable, and in the second mode control operations for the first memory block and the second memory block are executable,
wherein the control logic counts the number of accesses made to the second memory block in the first mode, and stores the number of accesses as scan data in the second memory block.

2. The memory device of claim 1, wherein the second memory block stores security data that the control logic reads only in the second mode.

3. The memory device of claim 2, wherein the control logic limits a control operation for the second memory block, when the number of accesses included in the scan data is equal to a predetermined reference number.

4. The memory device of claim 3, wherein the control logic limits the control operation for the second memory block by authenticating a user using a password or biometric information.

5. The memory device of claim 3, wherein the control logic limits the control operation for the second memory block by deleting data stored in a page buffer connected to the second memory block and changing a voltage level output by a voltage generator connected to the second memory block.

6. The memory device of claim 2, wherein the control logic deletes data stored in the second memory block when an attempt to initialize the scan data is detected.

7. The memory device of claim 1, wherein the control logic and the memory area are included in a single semiconductor chip.

8. The memory device of claim 1, wherein the control logic is included in a first semiconductor chip and the memory area is included in a second semiconductor chip different from the first semiconductor chip.

9. The memory device of claim 1, wherein the number of memory cells included in the first memory block is equal to the number of memory cells included in the second memory block, and
a data storage capacity of the first memory block is greater than a data storage capacity of the second memory block.

10. The memory device of claim 1, wherein the control logic stores the scan data in flag cells which are included in the second memory block and are programmed in a single level cell (SLC) scheme.

11. The memory device of claim 10, wherein the flag cells are connected to one word line in the second memory block.

12. The memory device of claim 1, wherein the control logic stores the scan data in at least one flag cell among memory cells included in the second memory block, and increases a threshold voltage of the at least one flag cell when the number of accesses is increased.

13. The memory device of claim 1, further comprising:
first page buffers connected to the first memory block and executing a reading operation and a programming operation for the first memory block; and
second page buffers connected to the second memory block and executing a reading operation and a programming operation for the second memory block,
wherein the number of latches included in each of the first page buffers is different from the number of latches included in each of the second page buffers.

14. A memory device, comprising:
a memory area having a plurality of memory blocks; and
a control logic configured to control the memory area,
wherein the control logic blocks access to at least one security block among the plurality of memory blocks in a first mode, and allows access to the at least one security block in a second mode, different from the first mode, and when a reading operation for the at least one security block is executed in the first mode, the reading operation and a programming operation for the at least one security block are executed.

15. The memory device of claim 14, wherein in the programming operation for the security block, executed in the first mode, the control logic records scan data, wherein the scan data includes the number of reading operations for the security block executed in the first mode.

16. The memory device of claim 15, wherein the control logic initializes the security block when an attempt to initialize the scan data is detected.

17. The memory device of claim 14, wherein the control logic executes an erase operation in a unit of each of the memory blocks when an erase command is received.

18. A memory device, comprising:
first word lines stacked on a substrate;
first channel layers penetrating through the first word lines to extend in a first direction perpendicular to the substrate, and providing first memory cells accessible in a first mode and a second mode, different from the first mode;
second word lines stacked on the substrate and electrically separated from the first word lines;
second channel layers penetrating through the second word lines to extend in the first direction, and providing second memory cells accessible only in the second mode; and
a control logic configured to select one of the first mode and the second mode as an operation mode, and store data corresponding to the number of times the second memory cells are accessed in the first mode, in the second memory cells.

19. The memory device of claim 18, further comprising:
a word line separating layer separating the first word lines and the second word lines.

20. The memory device of claim 18, wherein the number of the first word lines is equal to the number of the second word lines, and the number of the first channel layers is equal to the number of the second channel layers; and
a data storage capacity of the first memory cells is different from a data storage capacity of the second memory cells.

* * * * *